United States Patent
Horstman et al.

(10) Patent No.: US 9,765,192 B2
(45) Date of Patent: Sep. 19, 2017

(54) COMPOSITIONS OF RESIN-LINEAR ORGANOSILOXANE BLOCK COPOLYMERS

(71) Applicant: Dow Corning Corporation, Midland, MI (US)

(72) Inventors: John Bernard Horstman, Midland, MI (US); Steven Swier, Midland, MI (US); Yanhu Wei, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 15/023,137

(22) PCT Filed: Sep. 18, 2014

(86) PCT No.: PCT/US2014/056350
§ 371 (c)(1),
(2) Date: Mar. 18, 2016

(87) PCT Pub. No.: WO2015/042285
PCT Pub. Date: Mar. 26, 2015

(65) Prior Publication Data
US 2016/0208055 A1    Jul. 21, 2016

Related U.S. Application Data

(60) Provisional application No. 61/879,447, filed on Sep. 18, 2013.

(51) Int. Cl.

| | | |
|---|---|---|
| *C08G 77/44* | (2006.01) | |
| *C09D 183/10* | (2006.01) | |
| *C09D 183/14* | (2006.01) | |
| *C08G 77/20* | (2006.01) | |
| *C08L 83/10* | (2006.01) | |
| *C08L 83/14* | (2006.01) | |
| *H01L 33/56* | (2010.01) | |
| *H01L 23/29* | (2006.01) | |
| *C08G 77/50* | (2006.01) | |
| *C08G 77/00* | (2006.01) | |
| *H01L 33/50* | (2010.01) | |

(52) U.S. Cl.
CPC .......... *C08G 77/44* (2013.01); *C08G 77/20* (2013.01); *C08L 83/10* (2013.01); *C08L 83/14* (2013.01); *C09D 183/10* (2013.01); *C09D 183/14* (2013.01); *H01L 33/507* (2013.01); *H01L 33/56* (2013.01); *C08G 77/50* (2013.01); *C08G 77/80* (2013.01); *C08L 2203/206* (2013.01); *H01L 23/296* (2013.01); *H01L 33/501* (2013.01)

(58) Field of Classification Search
USPC ...................................... 528/10–43
See application file for complete search history.

(56) References Cited

U.S. PATENT DOCUMENTS

| 8,957,147 | B2 * | 2/2015 | Swier ............... | C08G 77/14 524/477 |
|---|---|---|---|---|
| 2013/0168727 | A1 * | 7/2013 | Horstman ............ | C08G 77/14 257/100 |
| 2013/0171354 | A1 * | 7/2013 | Horstman ............ | C08G 77/14 427/331 |
| 2013/0172496 | A1 * | 7/2013 | Horstman ............ | C08G 77/14 525/477 |

FOREIGN PATENT DOCUMENTS

| WO | WO-2012/040302 A1 | 3/2012 |
|---|---|---|
| WO | WO-2015/042285 A1 | 3/2015 |

OTHER PUBLICATIONS

"International Application Serial No. PCT/US2014/056350, International Search Report mailed Nov. 12, 2014", 3 pgs.
"International Application Serial No. PCT/US2014/056350, Written Opinion mailed Nov. 12, 2014", 7 pgs.
"European Application Serial No. 14778026.6, Communication Pursuant to Rules 161(1) land 162 EPC mailed Apr. 26, 2016", 2 pgs.
"European Application Serial No. 14778026.6, Response filed Oct. 12, 2016 to Communication Pursuant to Rules 161(1) and 162 EPC mailed Apr. 26, 2016", 18 pgs.
"International Application Serial No. PCT/US2014/056350, International Preliminary Report on Patentability mailed Mar. 31, 2016", 9 pgs.

* cited by examiner

*Primary Examiner* — Marc Zimmer
(74) *Attorney, Agent, or Firm* — Schwegman Lundberg & Woessner, P.A.

(57) ABSTRACT

The present disclosure provides hydrosilylation curable compositions comprising resin linear organosiloxane block copolymers comprising, among other things, from about 0.5 to about 5 mole % $C_1$ to $C_{30}$ hydrocarbyl group comprising at least one aliphatic unsaturated bond. Such hydrosilylation curable resin-linear organosiloxane block copolymers have significantly faster cure speed, relative to their condensation curable counterparts. A faster cure speed can be important for encapsulating electronic devices, such as light-emitting diode (LED) chip devices, particularly devices having tall structures.

31 Claims, No Drawings

COMPOSITIONS OF RESIN-LINEAR ORGANOSILOXANE BLOCK COPOLYMERS

CROSS-REFERENCE TO RELATED APPLICATIONS

This application is a U.S. national stage application filed under 35 U.S.C. §371 from International Application Serial No. PCT/US2014/056350, which was filed Sep. 18, 2014, and published as WO 2015/042285 on Mar. 26, 2015, and claims the benefit of U.S. Provisional Appl. Ser. No. 61/879,447, filed Sep. 18, 2013, which applications and publication are incorporated by reference as if reproduced herein and made a part hereof in their entirety, and the benefit of priority of each of which is claimed herein.

BACKGROUND

Many electronic devices use an encapsulant coating to protect electronic components from environmental factors. These protective coatings must be tough, durable, long lasting, easy to apply, and cure relatively quickly without the production of undesired byproducts. Many of the currently available coatings, however, lack toughness; are not durable; are not long-lasting; are not easy to apply; for certain applications, do not cure quickly enough; and, in some instances, produce undesired byproducts upon curing. There is therefore a continuing need to identify protective and/or functional coatings in many areas of emerging technologies.

SUMMARY

Embodiment 1 relates to an organosiloxane block copolymer comprising:
   40 to 90 mole percent disiloxy units of the formula $[R^1_2SiO_{2/2}]$,
   10 to 60 mole percent trisiloxy units of the formula $[R^2SiO_{3/2}]$,
   0.5 to 35 mole percent silanol groups $[\equiv SiOH]$;
   wherein:
   each $R^1$, at each occurrence, is independently a $C_1$ to $C_{30}$ hydrocarbyl or a $C_1$ to $C_{30}$ hydrocarbyl group comprising at least one aliphatic unsaturated bond,
   each $R^2$, at each occurrence, is independently a $C_1$ to $C_{30}$ hydrocarbyl or a $C_1$ to $C_{30}$ hydrocarbyl group comprising at least one aliphatic unsaturated bond;
   wherein:
   the disiloxy units $[R^1_2SiO_{2/2}]$ are arranged in linear blocks having an average of from 50 to 300 disiloxy units $[R^1_2SiO_{2/2}]$ per linear block;
   the trisiloxy units $[R^2SiO_{3/2}]$ are arranged in non-linear blocks having a molecular weight of at least 500 g/mole;
   at least 30% of the non-linear blocks are crosslinked with each other;
   each linear block is linked to at least one non-linear block via —Si—O—Si— linkages;
   the organosiloxane block copolymer has a weight average molecular weight of at least 20,000 g/mole; and
   the organosiloxane block copolymer comprises from about 0.5 to about 5 mole % $C_1$ to $C_{30}$ hydrocarbyl group comprising at least one aliphatic unsaturated bond.

Embodiment 2 relates to the organosiloxane block copolymer of Embodiment 1, wherein the organosiloxane block copolymer has a weight average molecular weight of about 40,000 g/mole to about 250,000 g/mole.

Embodiment 3 relates to the organosiloxane block copolymer of Embodiments 1-2, wherein the organosiloxane block copolymer comprises 1 to 35 mole percent silanol groups $[\equiv SiOH]$.

Embodiment 4 relates to the organosiloxane block copolymer of Embodiments 1-3, wherein the organosiloxane block copolymer comprises 30 to 60 mole percent trisiloxy units of the formula $[R^2SiO_{3/2}]$.

Embodiment 5 relates to a composition comprising the reaction product of:
   A) a resin linear organosiloxane block copolymer comprising:
      40 to 90 mole percent disiloxy units of the formula $[R^1_2SiO_{2/2}]$,
      10 to 60 mole percent trisiloxy units of the formula $[R^2SiO_{3/2}]$,
      0.5 to 35 mole percent silanol groups $[\equiv SiOH]$;
      wherein:
      each $R^1$, at each occurrence, is independently a $C_1$ to $C_{30}$ hydrocarbyl free of aliphatic unsaturation,
      each $R^2$, at each occurrence, is independently a $C_1$ to $C_{30}$ hydrocarbyl free of aliphatic unsaturation;
      wherein:
      the disiloxy units $[R^1_2SiO_{2/2}]$ are arranged in linear blocks having an average of from 50 to 300 disiloxy units $[R^1_2SiO_{2/2}]$ per linear block,
      the trisiloxy units $[R^2SiO_{3/2}]$ are arranged in non-linear blocks having a molecular weight of at least 500 g/mole, at least 30% of the non-linear blocks are crosslinked with each other,
      each linear block is linked to at least one non-linear block; and
      the organosiloxane block copolymer has a weight average molecular weight of at least 20,000 g/mole; and
   B) a compound of the formula $R^1R^2_2SiX$
      wherein each $R^1$, at each occurrence, is independently a $C_1$ to $C_{30}$ hydrocarbyl free of aliphatic unsaturation or a $C_1$ to $C_{30}$ hydrocarbyl group comprising at least one aliphatic unsaturated bond,
      each $R^2$, at each occurrence, is independently a $C_1$ to $C_{30}$ hydrocarbyl free of aliphatic unsaturation or a $C_1$ to $C_{30}$ hydrocarbyl group comprising at least one aliphatic unsaturated bond, and
      X is a hydrolyzable group chosen from —$OR^4$, F, Cl, Br, I, —$OC(O)R^4$, —$N(R^4)_2$, or —$ON=CR^4_2$, wherein $R^4$ is hydrogen or a $C_1$ to $C_6$ alkyl group that may be optionally substituted.

Embodiment 6 relates to the composition of Embodiment 5, wherein the resin linear organosiloxane block copolymer has a weight average molecular weight of about 40,000 g/mole to about 250,000 g/mole.

Embodiment 7 relates to the organosiloxane block copolymer of Embodiments 5-6, wherein the organosiloxane block copolymer comprises 1 to 35 mole percent silanol groups $[\equiv SiOH]$.

Embodiment 8 relates to the organosiloxane block copolymer of Embodiments 5-7, wherein the organosiloxane block copolymer comprises 30 to 60 mole percent trisiloxy units of the formula $[R^2SiO_{3/2}]$.

Embodiment 9 relates to a composition comprising the reaction product of:
   A) a linear organosiloxane having the formula:

$R^1_{3-p}(E)_p SiO(R^1_2SiO_{2/2})_n Si(E)_p R^1_{3-p}$, wherein each $R^1$, at each occurrence, is independently a $C_1$ to $C_{30}$ hydrocarbyl free of aliphatic unsaturation, n is 50 to 300, E is a hydrolyzable group chosen from $OR^4$, F, Cl, Br, I, $-OC(O)R^4$, $-N(R^4)_2$, or $-ON=CR^4_2$, wherein $R^4$ is hydrogen or a $C_1$ to $C_6$ alkyl group, and each p is, independently, 1, 2 or 3; and B) an organosiloxane resin comprising unit formula:

$$[R^1_2R^2SiO_{1/2}]_a[R^1R^2SiO_{2/2}]_b[R^1SiO_{3/2}]_c[R^2SiO_{3/2}]_d[SiO_{4/2}]_e,$$

wherein:

each $R^1$, at each occurrence, is independently a $C_1$ to $C_{30}$ hydrocarbyl free of aliphatic unsaturation or a $C_1$ to $C_{30}$ hydrocarbyl group comprising at least one aliphatic unsaturated bond, each $R^2$, at each occurrence, is independently a $C_1$ to $C_{30}$ hydrocarbyl free of aliphatic unsaturation or a $C_1$ to $C_{30}$ hydrocarbyl group comprising at least one aliphatic unsaturated bond, wherein the organosiloxane resin comprises 0 to 35 mole % silanol groups [≡SiOH], and the subscripts a, b, c, d, and e represent the mole fraction of each siloxy unit present in the organosiloxane resin and range as follows:

a is about 0 to about 0.6,
b is about 0 to about 0.6,
c is about 0 to about 1,
d is about 0 to about 1,
e is about 0 to about 0.6, with the provisos that b+c+d+e>0 and a+b+c+d+e≤1.

Embodiment 10 relates to a composition comprising the reaction product of:

A) a linear organosiloxane having the formula:

$$R^1_{3-p}(E)_pSiO(R^1_2SiO_{2/2})_nSi(E)_pR^1_{3-p},$$

wherein each $R^1$, at each occurrence, is independently a $C_1$ to $C_{30}$ hydrocarbyl free of aliphatic unsaturation, n is 50 to 300, E is a hydrolyzable group chosen from $-OR^4$, F, Cl, Br, I, $-OC(O)R^4$, $-N(R^4)_2$, or $-ON=CR^4_2$, wherein $R^4$ is hydrogen or a $C_1$ to $C_6$ alkyl group, and each p is, independently, 1, 2 or 3, and B) an organosiloxane resin comprising unit formula:

$$[R^1_2R^2SiO_{1/2}]_a[R^1R^2SiO_{2/2}]_b[R^1SiO_{3/2}]_c[R^2SiO_{3/2}]_d[SiO_{4/2}]_e,$$

wherein:

each $R^1$, at each occurrence, is independently a $C_1$ to $C_{30}$ hydrocarbyl free of aliphatic unsaturation, each $R^2$, at each occurrence, is independently a $C_1$ to $C_{30}$ hydrocarbyl free of aliphatic unsaturation, wherein the organosiloxane resin comprises 0 to 35 mole % silanol groups [≡SiOH], and the subscripts a, b, c, d, and e represent the mole fraction of each siloxy unit present in the organosiloxane resin and range as follows:

a is about 0 to about 0.6,
b is about 0 to about 0.6,
c is about 0 to about 1,
d is about 0 to about 1,
e is about 0 to about 0.6, with the provisos that b+c+d+e>0 and a+b+c+d+e≤1; and C) a compound of the formula $R^1_qSiX_{4-q}$ wherein each $R^1$, at each occurrence, is independently a $C_1$ to $C_{30}$ hydrocarbyl free of aliphatic unsaturation or a $C_1$ to $C_{30}$ hydrocarbyl group comprising at least one aliphatic unsaturated bond, q is 0, 1 or 2, and, each X is independently a hydrolyzable group chosen from $-OR^4$, F, Cl, Br, I, $-OC(O)R^4$, $-N(R^4)_2$, or $-ON=CR^4_2$, wherein $R^4$ is hydrogen or a $C_1$ to $C_6$ alkyl group that may be optionally substituted.

Embodiment 11 relates to the composition of Embodiment 10, wherein the product of the contacting between A) and B) is contacted with C).

Embodiment 12 relates to the composition of Embodiments 5-11, wherein the reaction product is contacted with a compound of the formula $R^5_qSiX_{4-q}$, wherein each $R^5$ is independently a $C_1$ to $C_8$ hydrocarbyl or a $C_1$ to $C_8$ halogen-substituted hydrocarbyl; and each X is independently a hydrolyzable group chosen from $-OR^4$, F, Cl, Br, I, $-OC(O)R^4$, $-N(R^4)_2$, or $-ON=CR^4_2$, wherein $R^4$ is hydrogen or a $C_1$ to $C_6$ alkyl group that may be optionally substituted.

Embodiment 13 relates to the composition of Embodiments 5-11, wherein the reaction product is an organosiloxane block copolymer and the organosiloxane block copolymer comprises from about 0.5 to about 5 mole % $C_1$ to $C_{30}$ hydrocarbyl group comprising at least one aliphatic unsaturated bond.

Embodiment 14 relates to the composition of Embodiment 9 or 10, wherein E is acetoxy and p is 1.

Embodiment 15 relates to the composition of Embodiments 5-14 further comprising a compound having unit formula:

$$[R^1_2R^2SiO_{1/2}]_a[R^1R^2SiO_{2/2}]_b[R^1SiO_{3/2}]_c[R^2SiO_{3/2}]_d[SiO_{4/2}]_e$$

comprising 0 to 35 mole % silanol groups [≡SiOH], wherein:

each $R^1$, at each occurrence, is independently H or a $C_1$ to $C_{30}$ hydrocarbyl free of aliphatic unsaturation, each $R^2$, at each occurrence, is independently H or a $C_1$ to $C_{30}$ hydrocarbyl free of aliphatic unsaturation, wherein the subscripts a, b, c, d, and e represent the mole fraction of each siloxy unit present and range as follows:

a is about 0 to about 0.6,
b is about 0 to about 0.6,
c is about 0 to about 1,
d is about 0 to about 1,
e is about 0 to about 0.6, with the provisos that:

b+c+d+e>0 and a+b+c+d+e≤1, and at least 1 mole % of $R^1$ and/or $R^2$ are H.

Embodiment 16 relates to the composition of Embodiments 5-15 further comprising a hydrosilylation catalyst.

Embodiment 17 relates to the composition of Embodiments 5-16, further comprising free resin that is not part of the block copolymer.

Embodiment 18 relates to the composition of Embodiments 5-10, wherein the composition is curable.

Embodiment 19 relates to the curable composition of Embodiment 18, wherein the curable composition has a cure speed in Pa/min of from about 1 to about 20 Pa/min at a heating rate of 5° C./min.

Embodiment 20 relates to the curable composition of Embodiment 18, wherein the curable composition is curable via at least two curing mechanisms.

Embodiment 21 relates to the curable composition of Embodiment 20, wherein said at least two curing mechanisms comprise hydrosylilation cure and condensation cure.

Embodiment 22 relates to the composition of Embodiments 5-10, wherein the composition is solid.

Embodiment 23 relates to the composition of Embodiment 22, further comprising free resin that is not part of the block copolymer.

Embodiment 24 relates to the composition of Embodiment 22, wherein the solid composition is a solid film composition.

Embodiment 25 relates to the composition of Embodiment 24, wherein the solid film composition has an optical transmittance of at least 95% at a film thickness of 0.5 mm or greater.

Embodiment 26 relates to the cured product of the compositions of Embodiments 5-10.

Embodiment 27 relates to the cured product of Embodiment 26, wherein the product is cured in the absence of a condensation catalyst.

Embodiment 28 relates to the cured product of Embodiment 26, wherein the product is cured in the presence of a phosphor or a filler.

Embodiment 29 relates to the cured product of Embodiment 26, wherein the ratio of the Young's modulus of the cured product after aging for 50 hours at 225° C. and the Young's modulus before aging is less than 3.

Embodiment 30 relates to the cured product of Embodiment 26, wherein the cured product generates less than 200 ppm benzene after 30 minutes at 180° C.

Embodiment 31 relates to the cured product of Embodiment 26, wherein the CIE b* value after aging for 72 h at 235° C. is no more than about 6.

DESCRIPTION

The present disclosure provides a process for preparing certain "resin linear" organosiloxane block copolymers, as well as curable and solid compositions comprising "resin linear" organosiloxane block copolymers. The "resin-linear" organosiloxane block copolymers contain a certain, relatively low amount (in mole %) of unsaturated groups so that they can be cured at least via hydrosilylation, though "dual cure" mechanisms are also contemplated. In embodiments encompassing resin linear organosiloxane block copolymers having dual cure mechanisms, hydrosilylation can be one cure mechanism. But, in addition to having a certain amount (in mole %) of unsaturated groups, the resin linear organosiloxane block copolymers can also comprise other reactive functionality (e.g., silanol, epoxide groups, cyanate ester groups, azide alkyne groups and the like) that can provide at least a second cure mechanism, including a condensation cure mechanism, Diels-Alder cure, azide-alkyne cycloaddition cure, radical cure, UV or radical acrylate cure, UV epoxy cure, Michael addition, and all reactions that are classified as "click chemistry."

It has been surprisingly and unexpectedly found that hydrosilylation curable resin-linear organosiloxane block copolymers with relatively low amounts of unsaturated groups have significantly faster cure speed, relative to their condensation curable counterparts. The faster cure speed has been instrumental for encapsulating and curing electronic devices, such as light-emitting diodes (LED), with high throughput, thereby lowering the total cost of the process and assisting in general adoption of solid state lighting. LED chip devices also typically contain tall structures like the chip and diode, which are particularly challenging to encapsulate, for example, by lamination processes. A tunable fast cure speed system can offer the level of control needed to be successful in these situations. In addition to having a fast cure speed, the hydrosilylation curable organosiloxane block copolymers exhibit, among other things, low tack and high shelf stability resulting from a relatively high resin glass transition temperature ($T_g$). Other benefits associated with the "resin linear" organosiloxane block copolymers, as well as curable and solid compositions comprising "resin linear" organosiloxane block copolymers, described herein include, but are not limited to, good dissipative or stress relaxation behavior, which assists in stress dissipation in LED devices; the ability to accommodate phosphor particles without detrimental impact on cure speed.

Organosiloxane Block Copolymers

In some embodiments, the "resin linear" organosiloxane block copolymers are organosiloxane block copolymers comprising:

40 to 90 mole percent disiloxy units of the formula $[R^1_2SiO_{2/2}]$, 10 to 60 mole percent trisiloxy units of the formula $[R^2SiO_{3/2}]$, 0.5 to 35 mole percent silanol groups [≡SiOH];

wherein:

each $R^1$, at each occurrence, is independently a $C_1$ to $C_{30}$ hydrocarbyl or a $C_1$ to $C_{30}$ hydrocarbyl group comprising at least one aliphatic unsaturated bond, each $R^2$, at each occurrence, is independently a $C_1$ to $C_{30}$ hydrocarbyl or a $C_1$ to $C_{30}$ hydrocarbyl group comprising at least one aliphatic unsaturated bond;

wherein:

the disiloxy units $[R^1_2SiO_{2/2}]$ (D) are arranged in linear blocks having an average of from 10 to 400 disiloxy units $[R^1_2SiO_{2/2}]$ per linear block;

the trisiloxy units $[R^2SiO_{3/2}]$ (T) are arranged in non-linear blocks having a molecular weight of at least 500 g/mole;

at least 30% of the non-linear blocks are crosslinked with each other;

each linear block is linked to at least one non-linear block via —Si—O—Si— linkages;

the organosiloxane block copolymer has a weight average molecular weight of at least 20,000 g/mole; and the organosiloxane block copolymer comprises from about 0.5 to about 5 mole % $C_1$ to $C_{30}$ hydrocarbyl group comprising at least one aliphatic unsaturated bond.

As used herein "organosiloxane block copolymers" or "resin-linear organosiloxane block copolymers" refer to organopolysiloxanes containing "linear" D siloxy units in combination with "resin" T siloxy units. In some embodiments, the organosiloxane copolymers are "block" copolymers, as opposed to "random" copolymers. As such, the "resin-linear organosiloxane block copolymers" of the disclosed embodiments refer to organopolysiloxanes containing D and T siloxy units, where the D units (i.e., $[R^1_2SiO_{2/2}]$ units) are primarily bonded together to form polymeric chains having, in some embodiments, an average of from 10 to 400 D units (e.g., an average of from about 10 to about 350 D units; about 10 to about 300 D units; about 10 to about 200 D units; about 10 to about 100 D units; about 50 to about 400 D units; about 100 to about 400 D units; about 150 to about 400 D units; about 200 to about 400 D units; about 300 to about 400 D units; about 50 to about 300 D units; about 100 to about 300 D units; about 150 to about 300 D units; about 200 to about 300 D units; about 100 to about 150 D units, about 115 to about 125 D units, about 90 to about 170 D units or about 110 to about 140 D units), which are referred herein as "linear blocks."

The T units (i.e., $[R^2SiO_{3/2}]$) are, in some embodiments, primarily bonded to each other to form branched polymeric chains, which are referred to as "non-linear blocks." In some embodiments, a significant number of these non-linear blocks may further aggregate to form "nano-domains" when solid forms of the block copolymer are provided. In some embodiments, these nano-domains form a phase separate from a phase formed from linear blocks having D units, such that a resin-rich phase forms. In some embodiments, the disiloxy units $[R^1_2SiO_{2/2}]$ are arranged in linear blocks having an average of from 10 to 400 disiloxy units $[R^1_2SiO_{2/2}]$ per linear block (e.g., an average of from about 10 to about 350 D units; about 10 to about 300 D units; about 10 to about 200 D units; about 10 to about 100 D units; about 50 to about 400 D units; about 100 to about 400 D units; about 150 to about 400 D units; about 200 to about 400 D units; about 300 to about 400 D units; about 50 to about 300 D units; about 100 to about 300 D units; about 150 to about 300 D units; about 200 to about 300 D units; about 100 to about 150 D units, about 115 to about 125 D units, about 90 to about 170 D units or about 110 to about 140 D units), and the trisiloxy units $[R^2SiO_{3/2}]$ are arranged in non-linear blocks having a molecular weight of at least 500 g/mole and at least 30% of the non-linear blocks are crosslinked with each other.

In some embodiments, the non-linear blocks have a number average molecular weight of at least 500 g/mole, e.g., at least 1000 g/mole, at least 2000 g/mole, at least 3000 g/mole, at least 4000 g/mole, at least 5000 g/mole, at least 6000 g/mole, at least 7000 g/mole or at least 8000 g/mole; or have a molecular weight of from about 500 g/mole to 8000 g/mole, from about 500 g/mole to 7000 g/mole, from about 500 g/mole to 6000 g/mole, from about 500 g/mole to 5000 g/mole, from about 500 g/mole to about 4000 g/mole, from about 500 g/mole to about 3000 g/mole, from about 500 g/mole to about 2000 g/mole, from about 500 g/mole to about 1000 g/mole, from about 1000 g/mole to 2000 g/mole, from about 1000 g/mole to about 1500 g/mole, from about 1000 g/mole to about 1200 g/mole, from about 1000 g/mole to 3000 g/mole, from about 1000 g/mole to about 2500 g/mole, from about 1000 g/mole to about 4000 g/mole, from about 1000 g/mole to 5000 g/mole, from about 1000 g/mole to 6000 g/mole, from about 1000 g/mole to 7000 g/mole, from about 1000 g/mole to 8000 g/mole, from about 2000 g/mole to about 3000 g/mole, from about 2000 g/mole to about 4000 g/mole, from about 2000 g/mole to 5000 g/mole, from about 2000 g/mole to 6000 g/mole, from about 2000 g/mole to 7000 g/mole or from about 2000 g/mole to 8000 g/mole.

In some embodiments, at least 30% of the non-linear blocks are crosslinked with each other, e.g., at least 40% of the non-linear blocks are crosslinked with each other; at least 50% of the non-linear blocks are crosslinked with each other; at least 60% of the non-linear blocks are crosslinked with each other; at least 70% of the non-linear blocks are crosslinked with each other; or at least 80% of the non-linear blocks are crosslinked with each other, wherein all of the percentages given herein to indicate percent non-linear blocks that are crosslinked are in weight percent. In other embodiments, from about 30% to about 80% of the non-linear blocks are crosslinked with each other; from about 30% to about 70% of the non-linear blocks are crosslinked with each other; from about 30% to about 60% of the non-linear blocks are crosslinked with each other; from about 30% to about 50% of the non-linear blocks are crosslinked with each other; from about 30% to about 40% of the non-linear blocks are crosslinked with each other; from about 40% to about 80% of the non-linear blocks are crosslinked with each other; from about 40% to about 70% of the non-linear blocks are crosslinked with each other; from about 40% to about 60% of the non-linear blocks are crosslinked with each other; from about 40% to about 50% of the non-linear blocks are crosslinked with each other; from about 50% to about 80% of the non-linear blocks are crosslinked with each other; from about 50% to about 70% of the non-linear blocks are crosslinked with each other; from about 55% to about 70% of the non-linear blocks are crosslinked with each other, from about 50% to about 60% of the non-linear blocks are crosslinked with each other; from about 60% to about 80% of the non-linear blocks are crosslinked with each other; or from about 60% to about 70% of the non-linear blocks are crosslinked with each other.

The crosslinking of the non-linear blocks may be accomplished via a variety of chemical mechanisms and/or moieties. For example, crosslinking of non-linear blocks within the block copolymer may result from the condensation of residual silanol groups present in the non-linear blocks of the copolymer.

In some embodiments, the organosiloxane block copolymers of the embodiments described herein comprise 40 to 90 mole percent disiloxy units of the formula $[R^1_2SiO_{2/2}]$, e.g., 50 to 90 mole percent disiloxy units of the formula $[R^1_2SiO_{2/2}]$; 60 to 90 mole percent disiloxy units of the formula $[R^1_2SiO_{2/2}]$; 65 to 90 mole percent disiloxy units of the formula $[R^1_2SiO_{2/2}]$; 70 to 90 mole percent disiloxy units of the formula $[R^1_2SiO_{2/2}]$; or 80 to 90 mole percent disiloxy units of the formula $[R^1_2SiO_{2/2}]$; 40 to 80 mole percent disiloxy units of the formula $[R^1_2SiO_{2/2}]$; 40 to 70 mole percent disiloxy units of the formula $[R^1_2SiO_{2/2}]$; 40 to 60 mole percent disiloxy units of the formula $[R^1_2SiO_{2/2}]$; 40 to 50 mole percent disiloxy units of the formula $[R^1_2SiO_{2/2}]$; 50 to 80 mole percent disiloxy units of the formula $[R^1_2SiO_{2/2}]$; 50 to 70 mole percent disiloxy units of the formula $[R^1_2SiO_{2/2}]$; 50 to 60 mole percent disiloxy units of the formula $[R^1_2SiO_{2/2}]$; 60 to 80 mole percent disiloxy units of the formula $[R^1_2SiO_{2/2}]$; 60 to 70 mole percent disiloxy units of the formula $[R^1_2SiO_{2/2}]$; or 70 to 80 mole percent disiloxy units of the formula $[R^1_2SiO_{2/2}]$.

In some embodiments, the organosiloxane block copolymers of the embodiments described herein comprise 10 to 60 mole percent trisiloxy units of the formula $[R^2SiO_{3/2}]$, e.g., 10 to 20 mole percent trisiloxy units of the formula $[R^2SiO_{3/2}]$; 10 to 30 mole percent trisiloxy units of the formula $[R^2SiO_{3/2}]$; 10 to 35 mole percent trisiloxy units of the formula $[R^2SiO_{3/2}]$; 10 to 40 mole percent trisiloxy units of the formula $[R^2SiO_{3/2}]$; 10 to 50 mole percent trisiloxy units of the formula $[R^2SiO_{3/2}]$; 20 to 30 mole percent trisiloxy units of the formula $[R^2SiO_{3/2}]$; 20 to 35 mole percent trisiloxy units of the formula $[R^2SiO_{3/2}]$; 20 to 40 mole percent trisiloxy units of the formula $[R^2SiO_{3/2}]$; 20 to 50 mole percent trisiloxy units of the formula $[R^2SiO_{3/2}]$; 20 to 60 mole percent trisiloxy units of the formula $[R^2SiO_{3/2}]$; 30 to 40 mole percent trisiloxy units of the formula $[R^2SiO_{3/2}]$; 30 to 50 mole percent trisiloxy units of the formula $[R^2SiO_{3/2}]$; 30 to 60 mole percent trisiloxy units of the formula $[R^2SiO_{3/2}]$; 40 to 50 mole percent trisiloxy units of the formula $[R^2SiO_{3/2}]$; or 40 to 60 mole percent trisiloxy units of the formula $[R^2SiO_{3/2}]$.

It should be understood that the organosiloxane block copolymers of the embodiments described herein may contain additional siloxy units, such as M siloxy units, Q siloxy units, other unique D or T siloxy units (for example, having organic groups other than $R^1$ or $R^2$), provided that the organosiloxane block copolymer contains the mole fractions of the disiloxy and trisiloxy units as described herein and comprises from about 0.5 to about 5 mole % (e.g., about 0.5 to about 1 mole %, about 0.5 to about 4.5 mole %, about 1 to about 4 mole %, about 2 to about 3 mole %, about 2 to about 4 mole %, about 1 to about 5 mole % or about 2 to about 5 mole %) $C_1$ to $C_{30}$ hydrocarbyl group comprising at least one aliphatic unsaturated bond.

In some embodiments, the resin-linear organosiloxane block copolymers also contain silanol groups (≡SiOH). The amount of silanol groups present on the organosiloxane block copolymer may vary from 0.5 to 35 mole percent silanol groups [≡SiOH], alternatively from 2 to 32 mole percent silanol groups [≡SiOH], alternatively from 8 to 22 mole percent silanol groups [≡SiOH], alternatively from 10 to 20 mole percent silanol groups [≡SiOH], alternatively from 15 to 20 mole percent silanol groups [≡SiOH], alternatively from 12 to 22 mole percent silanol groups [≡SiOH], alternatively from 15 to 25 mole percent silanol groups [≡SiOH], alternatively from 15 to 35 mole percent silanol groups [≡SiOH] or alternatively 1 to 35 mole percent silanol groups. The silanol groups may be present on any siloxy units within the organosiloxane block copolymer. The amount described herein represents the total amount of silanol groups found in the organosiloxane block copolymer. In some embodiments, the majority (e.g., greater than 75%, greater than 80%, greater than 90%; from about 75% to about 90%, from about 80% to about 90%, or from about 75% to about 85%) of the silanol groups will reside on the trisiloxy units, i.e., the resin component of the block copolymer. Although not wishing to be bound by any theory, the silanol groups present on the resin component of the organosiloxane block copolymer allows for the block copolymer to further react or cure at elevated temperatures.

At each occurrence, each $R^1$, when mentioned herein, may independently be a $C_1$ to $C_{30}$ hydrocarbyl (e.g., a $C_1$ to $C_{20}$ hydrocarbyl, a $C_1$ to $C_{10}$ hydrocarbyl or a $C_1$ to $C_6$ hydrocarbyl), where the hydrocarbyl group is free of aliphatic unsaturation and may independently be an alkyl, aryl, or alkylaryl group. Each $R^1$, at each occurrence, may independently be a $C_1$ to $C_{30}$ alkyl group, alternatively, at each occurrence, each $R^1$ may be a $C_1$ to $C_{18}$ alkyl group. Alternatively each $R^1$, at each occurrence, may be a $C_1$ to $C_6$ alkyl group such as methyl, ethyl, propyl, butyl, pentyl, or hexyl. Alternatively each $R^1$, at each occurrence, may be methyl. Each $R^1$, at each occurrence, may be an aryl group, such as phenyl, naphthyl, or an anthryl group. Alternatively, each $R^1$, at each occurrence, may be any combination of the aforementioned alkyl or aryl groups such that, in some embodiments, each disiloxy unit may have two alkyl groups (e.g., two methyl groups); two aryl groups (e.g., two phenyl groups); or an alkyl (e.g., methyl) and an aryl group (e.g., phenyl). Alternatively, each $R^1$, at each occurrence, may be phenyl or methyl, so long as the organosiloxane block copolymer comprises from about 0.5 to about 5 mole % (e.g., about 0.5 to about 1 mole %, about 0.5 to about 4.5 mole %, about 1 to about 4 mole %, about 2 to about 3 mole %, about 2 to about 4 mole %, about 1 to about 5 mole % or about 2 to about 5 mole %) $C_1$ to $C_{30}$ hydrocarbyl group comprising at least one aliphatic unsaturated bond.

In some embodiments, at each occurrence, each $R^1$, when mentioned herein, is independently a $C_1$ to $C_{30}$ hydrocarbyl, where the hydrocarbyl group comprises at least one aliphatic unsaturated bond. Examples of aliphatic unsaturated bonds include, but are not limited to, alkenyl or alkynyl bonds. In some embodiments, the aliphatic unsaturated bond is a terminal double bond. Examples of $C_2$ to $C_{30}$ (e.g., $C_2$ to $C_{20}$; $C_2$ to $C_{12}$; $C_2$ to $C_8$; or $C_2$ to $C_4$) hydrocarbyl groups include, but are not limited to, $H_2C$=CH—, $H_2C$=CHCH_2—, $H_2C$=C(CH_3)CH_2—, $H_2C$=CHC(CH_3)_2—, $H_2C$=CHCH_2CH_2—, $H_2C$=CHCH_2CH_2CH_2—, $H_2C$=CHCH_2CH_2CH_2CH_2—, and the like. Other examples of $C_2$ to $C_{30}$ hydrocarbyl groups include, but are not limited to HC≡C—, HC≡CCH_2—, HC≡CCH(CH_3)—, HC≡CC(CH_3)_2—, and HC≡CC(CH_3)_2CH_2—. Alternatively $R^1$ is a vinyl group, $H_2C$=CH—.

At each occurrence, each $R^2$, when mentioned herein, may independently be a $C_1$ to $C_{30}$ hydrocarbyl (e.g., a $C_1$ to $C_{20}$ hydrocarbyl, a $C_1$ to $C_{10}$ hydrocarbyl or a $C_1$ to $C_6$ hydrocarbyl), where the hydrocarbyl group is free of aliphatic unsaturation and may independently be an alkyl, aryl, or alkylaryl group. Each $R^2$, at each occurrence, may independently be a $C_1$ to $C_{30}$ alkyl group, alternatively, at each occurrence, each $R^2$ may be a $C_1$ to $C_{18}$ alkyl group. Alternatively each $R^2$, at each occurrence, may be a $C_1$ to $C_6$ alkyl group such as methyl, ethyl, propyl, butyl, pentyl, or hexyl. Alternatively each $R^2$, at each occurrence, may be methyl. Each $R^2$, at each occurrence, may be an aryl group, such as phenyl, naphthyl, or an anthryl group. Alternatively, each $R^2$, at each occurrence, may be any combination of the aforementioned alkyl or aryl groups such that, in some embodiments, each disiloxy unit may have two alkyl groups (e.g., two methyl groups); two aryl groups (e.g., two phenyl groups); or an alkyl (e.g., methyl) and an aryl group (e.g., phenyl). Alternatively, each $R^2$, at each occurrence, may be phenyl or methyl, so long as the organosiloxane block copolymer comprises from about 0.5 to about 5 mole % (e.g., about 0.5 to about 1 mole %, about 0.5 to about 4.5 mole %, about 1 to about 4 mole %, about 2 to about 3 mole %, about 2 to about 4 mole %, about 1 to about 5 mole % or about 2 to about 5 mole %) $C_1$ to $C_{30}$ hydrocarbyl group comprising at least one aliphatic unsaturated bond.

In some embodiments, at each occurrence, each $R^2$, when mentioned herein, is independently a $C_1$ to $C_{30}$ hydrocarbyl, where the hydrocarbyl group comprises at least one aliphatic unsaturated bond, as the term is defined herein.

As used throughout the specification, "hydrocarbyl" also includes substituted hydrocarbyl groups. "Substituted" as used throughout the specification refers broadly to replacement of one or more of the hydrogen atoms of the group with substituents known to those skilled in the art and resulting in a stable compound as described herein. Examples of suitable substituents include, but are not limited to, alkyl, alkenyl, alkynyl, cycloalkyl, aryl, alkaryl, hydroxy, alkoxy, aryloxy, carboxy (i.e., $CO_2H$), carboxyalkyl, carboxyaryl, cyano, cyanate ester (i.e., an —OCN group), silyl, siloxyl, phosphine, halogen, sulfur containing group, nitro, epoxy (where two adjacent carbon atoms, along with an oxygen atom to which they are attached, form an epoxide group) and the like. Substituted hydrocabyl also includes halogen substituted hydrocarbyls, where the halogen may be fluorine, chlorine, bromine or combinations thereof.

The organosiloxane block copolymers of the embodiments described herein have a weight average molecular weight ($M_w$) of at least 20,000 g/mole, alternatively a weight average molecular weight of at least 40,000 g/mole, alternatively a weight average molecular weight of at least 50,000 g/mole, alternatively a weight average molecular weight of at least 60,000 g/mole, alternatively a weight average molecular weight of at least 80,000 g/mole, or alternatively a weight average molecular weight of at least 100,000 g/mole. In some embodiments, the organosiloxane block copolymers of the embodiments described herein have a weight average molecular weight ($M_w$) of from about 20,000 g/mole to about 250,000 g/mole, from about 40,000 g/mole to about 250,000 g/mole, from about 50,000 g/mole to about 250,000 g/mole or from about 100,000 g/mole to about 250,000 g/mole, alternatively a weight average molecular weight of from about 45,000 g/mole to about 100,000 g/mole, alternatively a weight average molecular weight of from about 50,000 g/mole to about 100,000 g/mole, alternatively a weight average molecular weight of from about 50,000 g/mole to about 80,000 g/mole, alternatively a weight average molecular weight of from about 50,000 g/mole to about 70,000 g/mole, alternatively a weight average molecular weight of from about 50,000 g/mole to about 60,000 g/mole. In some embodiments, the organosiloxane block copolymers of the embodiments described herein have a number average molecular weight ($M_n$) of from about 15,000 to about 50,000 g/mole; from about 15,000 to about 30,000 g/mole; from about 20,000 to about 30,000 g/mole; or from about 20,000 to about 25,000 g/mole. The average molecular weight may be readily determined using Gel Permeation Chromatography (GPC) techniques, such as those described in the Examples.

Methods of Making Organosiloxane Block Copolymers

In some embodiments, the resin-linear organosiloxane block copolymers of the embodiments of the present invention may be prepared by a method comprising contacting (e.g., reacting):
A) a resin linear organosiloxane block copolymer comprising:
  40 to 90 mole percent disiloxy units of the formula [$R^1_2SiO_{2/2}$],
  10 to 60 mole percent trisiloxy units of the formula [$R^2SiO_{3/2}$],
  0.5 to 35 mole percent silanol groups [≡SiOH];
  wherein:
    each $R^1$, at each occurrence, is independently a $C_1$ to $C_{30}$ hydrocarbyl free of aliphatic unsaturation,
    each $R^2$, at each occurrence, is independently a $C_1$ to $C_{30}$ hydrocarbyl free of aliphatic unsaturation;
  wherein:
    the disiloxy units [$R^1_2SiO_{2/2}$] are arranged in linear blocks having an average of from 10 to 400 disiloxy units [$R^1_2SiO_{2/2}$] per linear block,
    the trisiloxy units [$R^2SiO_{3/2}$] are arranged in non-linear blocks having a molecular weight of at least 500 g/mole, at least 30% of the non-linear blocks are crosslinked with each other,
    each linear block is linked to at least one non-linear block via —Si—O—Si— linkages; and
    the organosiloxane block copolymer has a weight average molecular weight of at least 20,000 g/mole; with
B) a compound of the formula $R^1R^2_2SiX$
  wherein each $R^1$, at each occurrence, is independently a $C_1$ to $C_{30}$ hydrocarbyl free of aliphatic unsaturation or a $C_1$ to $C_{30}$ hydrocarbyl group comprising at least one aliphatic unsaturated bond,
  each $R^2$, at each occurrence, is independently a $C_1$ to $C_{30}$ hydrocarbyl free of aliphatic unsaturation or a $C_1$ to $C_{30}$ hydrocarbyl group comprising at least one aliphatic unsaturated bond, and
  X is a hydrolyzable group chosen from —$OR^4$, F, Cl, Br, I, —OC(O)$R^4$, —N($R^4$)$_2$, or —ON=C$R^4_2$, wherein $R^4$ is hydrogen or a $C_1$ to $C_6$ alkyl group that may be optionally substituted.

In other embodiments, the resin-linear organosiloxane block copolymers of the embodiments of the present invention may be prepared by a method comprising contacting:
A) a linear organosiloxane having the formula:

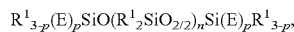

wherein each $R^1$, at each occurrence, is independently a $C_1$ to $C_{30}$ hydrocarbyl free of aliphatic unsaturation,
n is 10 to 400,
E is a hydrolyzable group chosen from —$OR^4$, F, Cl, Br, I, —OC(O)$R^4$, —N($R^4$)$_2$, or —ON=C$R^4_2$, wherein $R^4$ is hydrogen or a $C_1$ to $C_6$ alkyl group, and
each p is, independently, 1, 2 or 3; and
B) an organosiloxane resin comprising unit formula:

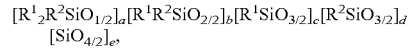

wherein each $R^1$, at each occurrence, is independently a $C_1$ to $C_{30}$ hydrocarbyl free of aliphatic unsaturation or a $C_1$ to $C_{30}$ hydrocarbyl group comprising at least one aliphatic unsaturated bond,
each $R^2$, at each occurrence, is independently a $C_1$ to $C_{30}$ hydrocarbyl free of aliphatic unsaturation or a $C_1$ to $C_{30}$ hydrocarbyl group comprising at least one aliphatic unsaturated bond,
wherein the organosiloxane resin comprises 0 to 35 mole % silanol groups [≡SiOH], and
the subscripts a, b, c, d, and e represent the mole fraction of each siloxy unit present in the organosiloxane resin and range as follows:
  a is about 0 to about 0.6,
  b is about 0 to about 1,
  c is about 0 to about 1,
  d is about 0 to about 1,
  e is about 0 to about 0.6,
  with the provisos that b+c+d+e>0 and a+b+c+d+e≤1.

In still other embodiments, the resin-linear organosiloxane block copolymers of the embodiments of the present invention may be prepared by a method comprising contacting:
A) a linear organosiloxane having the formula:

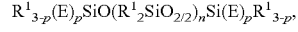

wherein each $R^1$, at each occurrence, is independently a $C_1$ to $C_{30}$ hydrocarbyl free of aliphatic unsaturation,
n is 10 to 400,
E is a hydrolyzable group chosen from —$OR^4$, F, Cl, Br, I, —OC(O)$R^4$, —N($R^4$)$_2$, or —ON=C$R^4_2$, wherein $R^4$ is hydrogen or a $C_1$ to $C_6$ alkyl group, and
each p is, independently, 1, 2 or 3, and
B) an organosiloxane resin comprising unit formula:

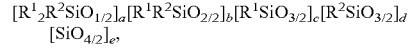

wherein each $R^1$, at each occurrence, is independently a $C_1$ to $C_{30}$ hydrocarbyl free of aliphatic unsaturation,
each $R^2$, at each occurrence, is independently a $C_1$ to $C_{30}$ hydrocarbyl free of aliphatic unsaturation,
wherein the organosiloxane resin comprises 0 to 35 mole % silanol groups [≡SiOH], and
the subscripts a, b, c, d, and e represent the mole fraction of each siloxy unit present in the organosiloxane resin and range as follows:
  a is about 0 to about 0.6,
  b is about 0 to about 0.6,
  c is about 0 to about 1,
  d is about 0 to about 1,
  e is about 0 to about 0.6,
  with the provisos that b+c+d+e>0 and a+b+c+d+e≤1; and C) a compound of the formula $R^1_q SiX_{4-q}$
   wherein each $R^1$, at each occurrence, is independently a $C_1$ to $C_{30}$ hydrocarbyl free of aliphatic unsaturation or a $C_1$ to $C_{30}$ hydrocarbyl group comprising at least one aliphatic unsaturated bond,
   q is 0, 1 or 2, and,
   each X is independently a hydrolyzable group chosen from —$OR^4$, F, Cl, Br, I, —$OC(O)R^4$, —$N(R^4)_2$, or —$ON=CR^4_2$, wherein $R^4$ is hydrogen or a $C_1$ to $C_6$ alkyl group that may be optionally substituted;
wherein the "contacting may be performed in any suitable order. For example, A) and B) may be contacted first, followed by contacting with C). Alternatively, A) and C) may be contacted first, followed by contacting with B); B) and C) may be contacted first, followed by contacting with A); or A), B), and C) may be contacted with each other substantially at the same time. In some embodiments, the product of contacting A) and B) is contacted with C).

The methods of making the organosiloxane block copolymers described herein, in some embodiments, yield a reaction product that is an organosiloxane block copolymers comprising:
   40 to 90 mole percent disiloxy units of the formula $[R^1_2SiO_{2/2}]$,
   10 to 60 mole percent trisiloxy units of the formula $[R^2SiO_{3/2}]$,
   0.5 to 35 mole percent silanol groups [≡SiOH];
   wherein:
      each $R^1$, at each occurrence, is independently a $C_1$ to $C_{30}$ hydrocarbyl or a $C_1$ to $C_{30}$ hydrocarbyl group comprising at least one aliphatic unsaturated bond,
      each $R^2$, at each occurrence, is independently a $C_1$ to $C_{30}$ hydrocarbyl or a $C_1$ to $C_{30}$ hydrocarbyl group comprising at least one aliphatic unsaturated bond;
   wherein:
      the disiloxy units $[R^1_2SiO_{2/2}]$ are arranged in linear blocks having an average of from 10 to 400 disiloxy units $[R^1_2SiO_{2/2}]$ per linear block;
      the trisiloxy units $[R^2SiO_{3/2}]$ are arranged in non-linear blocks having a molecular weight of at least 500 g/mole;
      at least 30% of the non-linear blocks are crosslinked with each other;
      each linear block is linked to at least one non-linear block via —Si—O—Si— linkages;
      the organosiloxane block copolymer has a weight average molecular weight of at least 20,000 g/mole; and
      the organosiloxane block copolymer comprises from about 0.5 to about 5 mole % $C_1$ to $C_{30}$ hydrocarbyl group comprising at least one aliphatic unsaturated bond.

In some embodiments, such organosiloxane block copolymer reaction products may be contacted with a compound of the formula $R^5_q SiX_{4-q}$, wherein each $R^5$ is independently a $C_1$ to $C_8$ hydrocarbyl (e.g., $C_1$ to $C_8$ alkyl group, or alternatively a phenyl group, or alternatively $R^5$ is methyl, ethyl, or a combination of methyl and ethyl) or a $C_1$ to $C_8$ halogen-substituted hydrocarbyl; and each X is independently a hydrolyzable group chosen from —$OR^4$, F, Cl, Br, I, —$OC(O)R^4$, —$N(R^4)_2$, or —$ON=CR^4_2$, wherein $R^4$ is hydrogen or a $C_1$ to $C_6$ alkyl group that may be optionally substituted.

In one embodiment, the compound of the formula $R^5_q SiX_{4-q}$ is an alkyltriacetoxysilane, such as methyltriacetoxysilane, ethyltriacetoxysilane, or a combination of both. Commercially available representative alkyltriacetoxysilanes include ETS-900 (Dow Corning Corp., Midland, Mich.), methyl tris(methylethylketoxime)silane (MTO), methyl triacetoxysilane, ethyl triacetoxysilane, tetraacetoxysilane, tetraoximesilane, dimethyl diacetoxysilane, dimethyl dioximesilane, and methyl tris(methylmethylketoxime)silane. In some embodiments, an organosiloxane block copolymer reaction product may be contacted with a compound of the formula $R^5_q SiX_{4-q}$ so as to introduce groups into the organosiloxane block copolymer that cure by a moisture cure mechanism following, e.g., a hydrosilylation cure.

The Linear Organosiloxane

The linear organosiloxane having the formula $R^1_{3-p}(E)_p SiO(R^1_2SiO_{2/2})_n Si(E)_p R^1_{3-p}$, wherein each $R^1$, at each occurrence, is independently a $C_1$ to $C_{30}$ hydrocarbyl free of aliphatic unsaturation; n is 10 to 400; E is a hydrolyzable group chosen from —$OR^4$, F, Cl, Br, I, —$OC(O)R^4$, —$N(R^4)_2$, or —$ON=CR^4_2$, wherein $R^4$ is hydrogen or a $C_1$ to $C_6$ alkyl group.

The subscript "n" may be considered as the degree of polymerization (dp) of the linear organosiloxane and may vary from 10 to 400 (e.g., an average of from about 10 to about 350 D units; about 10 to about 300 D units; about 10 to about 200 D units; about 10 to about 100 D units; about 50 to about 400 D units; about 100 to about 400 D units; about 150 to about 400 D units; about 200 to about 400 D units; about 300 to about 400 D units; about 50 to about 300 D units; about 100 to about 300 D units; about 150 to about 300 D units; about 200 to about 300 D units; about 100 to about 150 D units, about 115 to about 125 D units, about 90 to about 170 D units or about 110 to about 140 D units).

While the organosiloxane having the formula $R^1_{3-p}(E)_p SiO(R^1_2SiO_{2/2})_n Si(E)_p R^1_{3-p}$ is described as a linear, one skilled in the art recognizes that the linear organosiloxane may comprise a small amount of alternative siloxy units, such a T ($R^1SiO_{3/2}$) siloxy units. As such, the organosiloxane may be considered as being "predominately" linear by having a majority of D ($R^1_2SiO_{2/2}$) siloxy units. Furthermore, the linear organosiloxane may be a combination of several linear organosiloxanes. Still further, the linear organosiloxane may comprise silanol groups. In some embodiments, the linear organosiloxane comprises from about 0.5 to about 5 mole % silanol groups, e.g., from about 1 mole % to about 3 mole %; from about 1 mole % to about 2 mole % or from about 1 mole % to about 1.5 mole % silanol groups.

The Organosiloxane Resin

Organosiloxane resins comprising unit formula $[R^1_2R^2SiO_{1/2}]_a[R^1R^2SiO_{2/2}]_b[R^1SiO_{3/2}]_c[R^2SiO_{3/2}]_d[SiO_{4/2}]_e$, and methods for preparing them, wherein each $R^1$, at each occurrence, is independently a $C_1$ to $C_{30}$ hydrocarbyl free of aliphatic unsaturation and each $R^2$, at each occurrence, is independently a $C_1$ to $C_{30}$ hydrocarbyl free of aliphatic unsaturation, are known in the art. See, e.g., Published PCT Application Nos. WO2012/040302 and WO2012/040305, which are incorporated herein by reference in their entirety. In some embodiments, they are prepared by hydrolyzing an organosilane having three hydrolyzable groups on the silicon atom, such as a halogen or an alkoxy group in an organic solvent. A representative example for the preparation of a silsesquioxane resin may be found in U.S. Pat. No. 5,075,103. Furthermore, many organosiloxane resins are available commercially and sold either as a solid (flake or powder), or dissolved in an organic solvent. Suitable, non-limiting, commercially available organosiloxane resins include; Dow Corning® 217 Flake Resin, 233 Flake, 220 Flake, 249 Flake, 255 Flake, Z-6018 Flake (Dow Corning Corporation, Midland Mich.).

Organosiloxane resins comprising unit formula [R¹₂R²SiO₁/₂]ₐ[R¹R²SiO₂/₂]ᵦ[R¹SiO₃/₂]c[R²SiO₃/₂]d[SiO₄/₂]ₑ, and methods for preparing them, wherein each R¹, at each occurrence, is independently a $C_1$ to $C_{30}$ hydrocarbyl free of aliphatic unsaturation or a $C_1$ to $C_{30}$ hydrocarbyl group comprising at least one aliphatic unsaturated bond and each R², at each occurrence, is independently a $C_1$ to $C_{30}$ hydrocarbyl free of aliphatic unsaturation or a $C_1$ to $C_{30}$ hydrocarbyl group comprising at least one aliphatic unsaturated bond, may be made in a similar fashion.

The Compound of the Formula $R^1R^2_2SiX$

In some embodiments, a $C_1$ to $C_{30}$ hydrocarbyl group comprising at least one aliphatic unsaturated bond is introduced into the organosiloxane block copolymers of the embodiments of the present invention by contacting (e.g., reacting) a resin linear organosiloxane block copolymer comprising:

40 to 90 mole percent disiloxy units of the formula [$R^1_2SiO_{2/2}$],
  10 to 60 mole percent trisiloxy units of the formula [$R^2SiO_{3/2}$],
  0.5 to 35 mole percent silanol groups [≡SiOH];
  wherein:
    each R¹, at each occurrence, is independently a $C_1$ to $C_{30}$ hydrocarbyl free of aliphatic unsaturation,
    each R², at each occurrence, is independently a $C_1$ to $C_{30}$ hydrocarbyl free of aliphatic unsaturation;
  wherein:
    the disiloxy units [$R^1_2SiO_{2/2}$] are arranged in linear blocks having an average of from 10 to 400 disiloxy units [$R^1_2SiO_{2/2}$] per linear block,
    the trisiloxy units [$R^2SiO_{3/2}$] are arranged in non-linear blocks having a molecular weight of at least 500 g/mole, at least 30% of the non-linear blocks are crosslinked with each other,
    each linear block is linked to at least one non-linear block via —Si—O—Si— linkages; and
    the organosiloxane block copolymer has a weight average molecular weight of at least 20,000 g/mole; or
organosiloxane resins comprising unit formula [R¹₂R²SiO₁/₂]ₐ[R¹R²SiO₂/₂]ᵦ[R¹SiO₃/₂]c[R²SiO₃/₂]d[SiO₄/₂]ₑ; with a compound of the formula $R^1R^2_2SiX$, wherein each R¹, at each occurrence, is independently a $C_1$ to $C_{30}$ hydrocarbyl or a $C_1$ to $C_{30}$ hydrocarbyl group comprising at least one aliphatic unsaturated bond, each R², at each occurrence, is independently a $C_1$ to $C_{30}$ hydrocarbyl or a $C_1$ to $C_{30}$ hydrocarbyl group comprising at least one aliphatic unsaturated bond, and X is a hydrolyzable group chosen from —OR⁴, F, Cl, Br, I, —OC(O)R⁴, —N(R⁴)₂, or —ON=CR⁴₂, wherein R⁴ is hydrogen or a $C_1$ to $C_6$ alkyl group that may be optionally substituted.

In one embodiment, the compound of the formula $R^1R^2_2SiX$ may be a compound of the formula (vinyl)$R^2_2SiX$, (vinyl)$R^2_2SiCl$, (vinyl)(CH₃)₂SiX, (vinyl)(CH₃)₂SiCl, (vinyl)(phenyl)₂SiX, (vinyl)(phenyl)₂SiCl, (vinyl-phenyl)$R^2_2SiX$ or (vinyl-phenyl)$R^2_2SiCl$ The amount of organosilane having the formula $R^1R^2_2SiX$, when used, may vary, but, in some embodiments, is an amount sufficient to ultimately provide an organosiloxane block copolymer comprising from about 0.5 to about 20 mole % (e.g., about 0.5 to about 1 mole %, about 0.5 to about 4.5 mole %, about 1 to about 4 mole %, about 2 to about 3 mole %, about 2 to about 4 mole %, about 1 to about 5 mole %, about 2 to about 5 mole %, about 2 to about 10 mole %, about 5 to about 10 mole %, about 5 to about 15 mole % about 10 to about 20 mole % or about 5 to about 20 mole %) $C_1$ to $C_{30}$ hydrocarbyl group comprising at least one aliphatic unsaturated bond.

Curable Resin-Linear Organosiloxane Block Copolymer Compositions

The present disclosure also provides curable compositions comprising resin linear organosiloxane block copolymers comprising, among other things, from about 0.5 to about 5 mole % $C_1$ to $C_{30}$ hydrocarbyl group comprising at least one aliphatic unsaturated bond and a suitable solvent (e.g., an aromatic solvent, such as benzene, toluene, xylene, or combinations thereof). The curable compositions may be cured via a hydrosilylation reaction in the presence of a compound having unit formula:

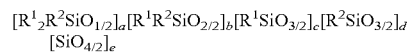

comprising 0 to 35 mole % silanol groups [≡SiOH], wherein:
  each R¹, at each occurrence, is independently H or a $C_1$ to $C_{30}$ hydrocarbyl free of aliphatic unsaturation,
  each R², at each occurrence, is independently H or a $C_1$ to $C_{30}$ hydrocarbyl free of aliphatic unsaturation,
  wherein the subscripts a, b, c, d, and e represent the mole fraction of each siloxy unit present and range as follows:
    a is about 0 to about 0.6,
    b is about 0 to about 0.6,
    c is about 0 to about 1,
    d is about 0 to about 1,
    e is about 0 to about 0.6,
  with the provisos that:
    b+c+d+e>0 and a+b+c+d+e≤1, and
    at least about 1 mole % (e.g., at least about 5 mole %, at least about 10 mole %, at least about 15 mole % or at least about 20 mole %; or from about 1 to about 20 mole %, about 1 to about 10 mole % or about 1 to about 5 mole %) of R¹ and/or R² are H.

The present disclosure also provides curable compositions comprising resin linear organosiloxane block copolymers comprising, among other things, from about 0.5 to about 5 mole % $C_1$ to $C_{30}$ hydrocarbyl group comprising at least one aliphatic unsaturated bond and a suitable solvent (e.g., an aromatic solvent, such as benzene, toluene, xylene, or combinations thereof). The curable compositions may be cured via a hydrosilylation reaction in the presence of a compound having unit formula:

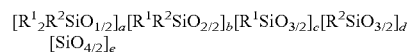

comprising 0 to 35 mole % silanol groups [≡SiOH], wherein:
  each R¹, at each occurrence, is independently H, a silane radical of the formula —[R⁶R⁷Si]ₖ[R⁶R⁷SiH] (wherein R⁶, R⁷ are independently a H or a $C_1$ to $C_{30}$ hydrocarbyl free of aliphatic unsaturation, k is an integer from 0 to 10) or a $C_1$ to $C_{30}$ hydrocarbyl free of aliphatic unsaturation,
  each R², at each occurrence, is independently H, a silane radical of the formula —[R⁶R⁷Si]ₖ[R⁶R⁷SiH] (wherein R⁶, R⁷ are independently a H or a $C_1$ to $C_{30}$ hydrocarbyl free of aliphatic unsaturation, k is an integer from 0 to 10) or a $C_1$ to $C_{30}$ hydrocarbyl free of aliphatic unsaturation,
  wherein the subscripts a, b, c, d, and e represent the mole fraction of each siloxy unit present and range as follows:
    a is about 0 to about 0.6,
    b is about 0 to about 0.6,
    c is about 0 to about 1, d is about 0 to about 1,
e is about 0 to about 0.6,
with the provisos that:
b+c+d+e>0 and a+b+c+d+e≤1, and
at least about 1 mole % (e.g., at least about 5 mole %, at least about 10 mole %, at least about 15 mole % or at least about 20 mole %; or from about 1 to about 20 mole %, about 1 to about 10 mole % or about 1 to about 5 mole %) of $R^1$ and/or $R^2$ are H or a silane radical of the formula —$[R^6R^7Si]_k[R^6R^7SiH]$.

In one embodiment, compounds having the unit formula $[R^1_2R^2SiO_{1/2}]_a[R^1R^2SiO_{2/2}]_b[R^1SiO_{3/2}]_c[R^2SiO_{3/2}]_d$ $[SiO_{4/2}]_e$ are compounds of the formula $R^1_qR^3_{(3-q)}SiO(R^1_2SiO_{2/2})_mSiR^3_{(3-q)}R^1_q$, where each $R^1$, at each occurrence, is independently a $C_1$ to $C_{30}$ hydrocarbyl free of aliphatic unsaturation; m is from 0 to 50 (e.g., about 10 to about 50 D units; about 20 to about 50 D units; about 5 to about 40 D units; or about 10 to about 40 D units), alternatively 0 to 10, alternatively 0 to 5, alternatively m is 0; q is 0, 1, or 2, alternatively q is 2, and each $R_3$, at each occurrence, is independently H or $R^1$, with the proviso that at least one $R_3$ at each terminus of the compound of the formula $R^1_qR^3_{(3-q)}SiO(R^1_2SiO_{2/2})_mSiR^3_{(3-q)}R^1_q$ is H.

In some embodiments, the compounds having unit formula $[R^1_2R^2SiO_{1/2}]_a[R^1R^2SiO_{2/2}]_b[R^1SiO_{3/2}]_c[R^2SiO_{3/2}]_d$ $[SiO_{4/2}]_e$ or the compounds of the formula $R^1_qR^3_{(3-q)}SiO(R^1_2SiO_{2/2})_mSiR^3_{(3-q)}R^1_q$ have the formula $H(CH_3)_2SiO[(CH_3)_2SiO_{2/2})]_nSi(CH_3)_2H$, where n may vary from 10 to 400 (e.g., an average of from about 10 to about 350 D units; about 10 to about 300 D units; about 10 to about 200 D units; about 10 to about 100 D units; about 50 to about 400 D units; about 100 to about 400 D units; about 150 to about 400 D units; about 200 to about 400 D units; about 300 to about 400 D units; about 50 to about 300 D units; about 100 to about 300 D units; about 150 to about 300 D units; about 200 to about 300 D units; about 100 to about 150 D units, about 115 to about 125 D units, about 90 to about 170 D units or about 110 to about 140 D units.

In a further embodiment, the compounds having unit formula $[R^1_2R^2SiO_{1/2}]_a[R^1R^2SiO_{2/2}]_b[R^1SiO_{3/2}]_c[R^2SiO_{3/2}]_d[SiO_{4/2}]_e$ or the compounds of the formula $R^1_qR^3_{(3-q)}SiO(R^1_2SiO_{2/2})_mSiR^3_{(3-q)}R^1_q$ have the formula $H(CH_3)_2SiOSi(CH_3)_2H$, $H(CH_3)_2SiOSi(CH_3)_2H$, $H(Ph)_2SiOSi(CH_3)_2H$, $H(CH_3)_2SiOSi(CH_3)_2(Ph)H$, $H(Ph)_2SiOSi(Ph)_2H$, $H(CH_3)_2SiOSi(CH_3)_2OSi(CH_3)_2H$, $H(CH_3)_2SiOSi(Ph)(CH_3)OSi(CH_3)_2H$, $H(CH_3)_2SiOSi(Ph)_2OSi(CH_3)_2H$, $H(CH_3)(Ph)SiOSi(Ph)(CH_3)OSi(Ph)(CH_3)H$, $H(CH_3)(Ph)SiOSi(Ph)_2OSi(Ph)(CH_3)H$ or $H(CH_3)_2SiOSi(Ph)_2OSi(Ph)_2OSi(CH_3)_2H$.

In other embodiments, the curable compositions may be cured via a hydrosilylation reaction in the presence of a compound having unit formula:

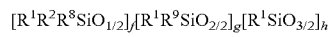

wherein $R^1$ and $R^2$ are independently a $C_1$ to $C_{30}$ hydrocarbyl free of aliphatic unsaturation, $R^8$ and $R^9$ are independently a H, a $C_1$ to $C_{30}$ hydrocarbyl free of aliphatic unsaturation or a silane radical of the formula —$[R^{10}R^{11}Si]_p[R^{10}R^{11}SiH]$ (wherein $R^{10}$, $R^{11}$ is independently a H or a $C_1$ to $C_{30}$ hydrocarbyl free of aliphatic unsaturation, p is an integer from 0 to 10), f is an integer from 0 to 100 (e.g., from 2 to 100, 40 to 50, 40 to 60, 50 to 70, 40 to 80, 40 to 70, 1 to 80, 1 to 10, 0 to 10, 1 to 6 or 10 to 70), g is an integer from 0 to 50 (e.g., from 1 to 50, 1 to 30, 1 to 8, 1 to 6 or 1 to 4), h is an integer from 0 to 60 (e.g., from 30 to 50, 0 to 15, 0 to 40, 10 to 40, 20 to 40, 0 to 10, 0 to 5 or 1 to 5), and the number of SiH groups in the compound having unit formula $[R^1R^2R^8SiO_{1/2}]_f[R^1R^9SiO_{2/2}]_g[R^1SiO_{3/2}]_h$ is ≥2 per molecule (e.g., ≥4, ≥6, ≥8, ≥10; or from 2 to 10 per molecule).

Non-limiting examples of compounds having unit formula $[R^1R^2R^8SiO_{1/2}]_f[R^1R^9SiO_{2/2}]_g[R^1SiO_{3/2}]_h$ wherein g is 0 include:

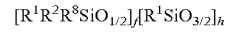

wherein $R^1$ and $R^2$ is independently a $C_1$ to $C_{30}$ hydrocarbyl free of aliphatic unsaturation, $R^8$ is independently a H, a $C_1$ to $C_{30}$ hydrocarbyl free of aliphatic unsaturation or a silane radical of the formula —$[R^{10}R^{11}Si]_p[R^{10}R^{11}SiH]$ (wherein $R^{10}$, $R^{11}$ is independently a H or a $C_1$ to $C_{30}$ hydrocarbyl free of aliphatic unsaturation, p is an integer from 0 to 10), f is an integer from 2 to 100 (e.g., from 40 to 50, 40 to 60, 50 to 70, 40 to 80, 40 to 70, 2 to 80, 2 to 10, 2 to 6 or 10 to 70), h is an integer from 0 to 60 (e.g., from 30 to 50, 0 to 15, 0 to 40, 10 to 40, 20 to 40, 0 to 10, 0 to 5 or 1 to 5), and the number of SiH groups in the compound having unit formula $[R^1R^2R^8SiO_{1/2}]_f[R^1SiO_{3/2}]_h$ is ≥2 per molecule (e.g., ≥4, ≥6, ≥8, 10; or from 2 to 10 per molecule).

Other non-limiting examples of compounds having unit formula $[R^1R^2R^8SiO_{1/2}]_f[R^1R^9SiO_{2/2}]_g[R^1SiO_{3/2}]_h$ wherein g is 0 include:

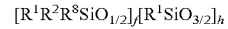

wherein $R^1$ and $R^2$ is independently $C_1$ to $C_{10}$ alkyl (e.g., $C_1$ to $C_8$ alkyl, $C_1$ to $C_5$ alkyl or $C_1$ to $C_3$ alkyl) or $C_6$ to $C_{14}$ aryl (e.g., $C_6$ to $C_{10}$ aryl), $R^8$ is independently a H or a $C_1$ to $C_{10}$ alkyl (e.g., $C_1$ to $C_8$ alkyl, $C_1$ to $C_5$ alkyl or $C_1$ to $C_3$ alkyl) or $C_6$ to $C_{14}$ aryl (e.g., $C_6$ to $C_{10}$ aryl), f is an integer from 2 to 100 (e.g., from 40 to 50, 40 to 60, 50 to 70, 40 to 80, 40 to 70, 2 to 80, 2 to 10, 2 to 6 or 10 to 70), h is an integer from 0 to 60 (e.g., from 30 to 50, 0 to 15, 0 to 40, 10 to 40, 20 to 40, 0 to 10, 0 to 5 or 1 to 5), and at least two $R^8$ are H, such that the number of SiH groups in the compound having unit formula $[R^1R^2R^8SiO_{1/2}]_f[R^1SiO_{3/2}]_h$ is ≥2 per molecule (e.g., ≥4, ≥6, ≥8, ≥10; or from 2 to 10 per molecule).

Still other non-limiting examples of compounds having unit formula $[R^1R^2R^8SiO_{1/2}]_f[R^1R^9SiO_{2/2}]_g[R^1SiO_{3/2}]_h$ wherein g is 0 include:

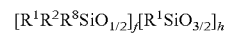

wherein $R^1$ and $R^2$ is independently $C_1$ to $C_3$ alkyl or $C_6$ to $C_{10}$ aryl, $R^8$ is independently a H, $C_1$ to $C_3$ alkyl or $C_6$ to $C_{10}$ aryl, f is an integer from 2 to 100 (e.g., from 40 to 50, 40 to 60, 50 to 70, 40 to 80, 40 to 70, 2 to 80, 2 to 10, 2 to 6 or 10 to 70), h is an integer from 0 to 60 (e.g., from 30 to 50, 0 to 15, 0 to 40, 10 to 40, 20 to 40, 0 to 10, 0 to 5 or 1 to 5), and at least two $R^8$ are H, such that the number of SiH groups in the compound having unit formula $[R^1R^2R^8SiO_{1/2}]_f[R^1SiO_{3/2}]_h$ is ≥2 per molecule (e.g., ≥4, ≥6, ≥8, ≥10; or from 2 to 10 per molecule).

Yet other non-limiting examples of compounds having unit formula $[R^1R^2R^8SiO_{1/2}]_f[R^1R^9SiO_{2/2}]_g[R^1SiO_{3/2}]_h$ wherein g is 0 include:

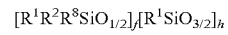

wherein $R^1$ is methyl or phenyl; $R^2$ is methyl or phenyl; $R^8$ is H, f is an integer from 2 to 100 (e.g., from 40 to 50, 40 to 60, 50 to 70, 40 to 80, 40 to 70, 2 to 80, 2 to 10, 2 to 6 or 10 to 70), h is an integer from 0 to 60 (e.g., from 30 to 50, 0 to 15, 0 to 40, 10 to 40, 20 to 40, 0 to 10, 0 to 5 or 1 to 5), such that the number of SiH groups in the crosslinker is ≥2 per crosslinker molecule (e.g., ≥4, ≥6, ≥8, ≥10; or from 2 to 10 per crosslinker molecule). Or, in some embodiments, $R^1$ is methyl or phenyl; $R^2$ is methyl or phenyl; $R^8$ is H, e is an integer from 40 to 80 (e.g., from 40 to 50, 40 to 60 or 50 to 70), g is an integer from 30 to 60, such that the number of SiH groups in the compound having unit formula $[R^1R^2R^8SiO_{1/2}]_f[R^1SiO_{3/2}]_h$ is ≥2 per molecule (e.g., ≥4, ≥6, ≥8, ≥10; or from 2 to 10 per molecule).

Non-limiting examples of compounds having unit formula $[R^1R^2R^8SiO_{1/2}]_f[R^1R^9SiO_{2/2}]_g[R^1SiO_{3/2}]_h$ wherein h is 0:

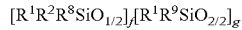

wherein $R^1$ and $R^2$ are independently a $C_1$ to $C_{30}$ hydrocarbyl free of aliphatic unsaturation, $R^8$ and $R^9$ are independently a H, a $C_1$ to $C_{30}$ hydrocarbyl free of aliphatic unsaturation or a silane radical of the formula —$[R^{10}R^{11}Si]_p[R^{10}R^{11}SiH]$ (wherein $R^{10}$, $R^{11}$ is independently a H or a $C_1$ to $C_{30}$ hydrocarbyl free of aliphatic unsaturation, p is an integer from 0 to 10), f is an integer from 0 to 10 (e.g., from 0 to 9, 1 to 9, 2 to 8, 2 to 6 or 2 to 4), g is an integer from 0 to 10 (e.g., from 0 to 9, from 0 to 7, from 0 to 5, from 1 to 8, 1 to 6 or 1 to 4), and the number of SiH groups in the compound having unit formula $[R^1R^2R^8SiO_{1/2}]_f[R^1R^9SiO_{2/2}]_g$ is ≥2 per molecule (e.g., ≥4, ≥6, ≥8, ≥10; or from 2 to 10 per molecule).

Other non-limiting examples of compounds having unit formula $[R^1R^2R^8SiO_{1/2}]_f[R^1R^9SiO_{2/2}]_g[R^1SiO_{3/2}]_h$ wherein h is 0:

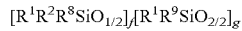

wherein $R^1$, $R^2$, and $R^9$ is independently $C_1$ to $C_{10}$ alkyl (e.g., $C_1$ to $C_8$ alkyl, $C_1$ to $C_5$ alkyl or $C_1$ to $C_3$ alkyl) or $C_6$ to $C_{14}$ aryl (e.g., $C_6$ to $C_{10}$ aryl), $R^8$ is independently a H or a $C_1$ to $C_{10}$ alkyl (e.g., $C_1$ to $C_8$ alkyl, $C_1$ to $C_5$ alkyl or $C_1$ to $C_3$ alkyl) or $C_6$ to $C_{14}$ aryl (e.g., $C_6$ to $C_{10}$ aryl), f is an integer from 2 to 10 (e.g., from 2 to 8, 2 to 6 or 2 to 4), g is an integer from 0 to 10 (e.g., from 1 to 8, 1 to 6 or 1 to 4), and at least two $R^8$ are H such that the number of SiH groups in the compound having unit formula $[R^1R^2R^8SiO_{1/2}]_f[R^1R^9SiO_{2/2}]_g$ is ≥2 per molecule (e.g., ≥4, ≥6, ≥8, ≥10; or from 2 to 10 per molecule).

Still other non-limiting examples of compounds having unit formula $[R^1R^2R^8SiO_{1/2}]_f[R^1R^9SiO_{2/2}]_g[R^1SiO_{3/2}]_h$ wherein h is 0:

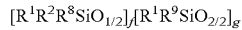

wherein $R^1$, $R^2$, and $R^9$ is independently $C_1$ to $C_3$ alkyl or $C_6$ to $C_{10}$ aryl, $R^8$ is independently a H, $C_1$ to $C_3$ alkyl or $C_6$ to $C_{10}$ aryl, f is an integer from 2 to 10 (e.g., from 2 to 8, 2 to 6 or 2 to 4), g is an integer from 0 to 10 (e.g., from 0 to 9, from 0 to 7, from 0 to 5, from 1 to 8, 1 to 6 or 1 to 4), and at least two $R^8$ are H such that the number of SiH groups in the compound having unit formula $[R^1R^2R^8SiO_{1/2}]_f[R^1R^9SiO_{2/2}]_g$ is ≥2 per molecule (e.g., ≥4, ≥6, ≥8, ≥10; or from 2 to 10 per molecule).

Yet other non-limiting examples of compounds having unit formula $[R^1R^2R^8SiO_{1/2}]_f[R^1R^9SiO_{2/2}]_g[R^1SiO_{3/2}]_h$ wherein h is 0:

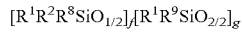

wherein $R^1$ is methyl or phenyl; $R^2$ is methyl or phenyl; $R^9$ is $R^2$ is methyl or phenyl; $R^8$ is H, f is an integer from 2 to 10 (e.g., from 2 to 8, 2 to 6 or 2 to 4), and g is an integer from 1 to 10 (e.g., from 1 to 8, 1 to 6 or 1 to 4). Or, in some embodiments, $R^1$ is methyl or phenyl; $R^2$ is methyl or phenyl; $R^9$ is $R^2$ is methyl or phenyl; $R^8$ is H, f is an integer from 2 to 10 (e.g., from 2 to 8, 2 to 6 or 2 to 4), and g is an integer from 0 to 10 (e.g., from 0 to 9, from 0 to 7, from 0 to 5, from 1 to 8, 1 to 6 or 1 to 4).

In some embodiments, a combination of compounds of the formula $[R^1R^2R^8SiO_{1/2}]_f[R^1R^9SiO_{2/2}]_g$ and $[R^1R^2R^8SiO_{1/2}]_f[R^1SiO_{3/2}]_h$ (e.g., $M^H_2D^{Ph}_2$ and $M^H_{60}T^{Ph}_{40}$, respectively) is used in the curable compositions of the various embodiments of the present invention. When a combination of two different compounds of the formula $[R^1R^2R^8SiO_{1/2}]_e[R^1R^9SiO_{2/2}]_f$ and $[R^1R^2R^8SiO_{1/2}]_e[R^1SiO_{3/2}]_g$ is used, the compounds can be used in any suitable amount and in any suitable ratio. In some examples, a suitable w/w ratio of the two different compounds of the formula $[R^1R^2R^8SiO_{1/2}]_e[R^1R^9SiO_{2/2}]_f$ and $[R^1R^2R^8SiO_{1/2}]_e[R^1SiO_{3/2}]_g$ is from about 8:1 to about 1:8 (e.g., from about 6:1 to about 1:1, about 5:1 to about 1:1; about 5:1 to about 2:1; or about 5:1 to about 3:1 w/w).

The hydrosilylation reaction may be conducted under any suitable conditions known in the art for effecting hydrosilylation reactions.

The curable compositions may contain a hydrosilylation catalyst. The hydrosilylation catalyst may be any suitable hydrosilylation catalyst, including, Group VIII metal based catalyst selected from a platinum, rhodium, iridium, palladium, ruthenium or iron. Group VIII group metal containing catalysts useful to catalyze the hydrosilylation reaction can be any catalyst known to catalyze reactions of silicon bonded hydrogen atoms with silicon bonded moieties comprising unsaturated hydrocarbon groups. In some embodiments, the Group VIII metal for use as a catalyst to effect the hydrosilylation is a platinum based catalyst such as platinum metal, platinum compounds and platinum complexes.

Suitable platinum catalysts include, but are not limited to, the catalyst described in U.S. Pat. No. 2,823,218 (e.g., "Speier's catalyst") and U.S. Pat. No. 3,923,705, the entireties of both of which are incorporated by reference as if fully set forth herein. Other suitable platinum catalysts include, but are not limited to, the platinum catalyst referred to as "Karstedt's catalyst," which are described in U.S. Pat. Nos. 3,715,334 and 3,814,730. Karstedt's catalyst is a platinum divinyl tetramethyl disiloxane complex, in some cases, containing about one-weight percent of platinum in a solvent such as toluene. Alternatively platinum catalysts include, but are not limited to, the reaction product of chloroplatinic acid and an organosilicon compound containing terminal aliphatic unsaturation, including the catalysts described in U.S. Pat. No. 3,419,593, the entirety of which is incorporated by reference as if fully set forth herein. Alternatively, hydrosilylation catalysts include, but are not limited to, neutralized complexes of platinum chloride and divinyl tetramethyl disiloxane, as described in U.S. Pat. No. 5,175,325. Further suitable hydrosilylation catalysts are described in, for example, U.S. Pat. Nos. 3,159,601; 3,220,972; 3,296,291; 3,516,946; 3,989,668; 4,784,879; 5,036,117; and 5,175,325 and EP 0 347 895 B1.

The hydrosilylation catalyst may be added in an amount equivalent to as little as 0.001 parts by weight of elemental platinum group metal, per one million parts (ppm) of the total reaction composition. In some embodiments, the concentration of the hydrosilylation catalyst as compared to the solids of the the reaction composition is the concentration capable of providing the equivalent of at least 1 part per million of elemental platinum group metal. A catalyst concentration providing the equivalent of 1 to 500, alternatively 50 to 500, alternatively 50 to 200 parts per million of elemental platinum group metal may be used.

The present disclosure also provides curable compositions comprising resin linear organosiloxane block copolymers comprising, among other things, from about 0.5 to about 5 mole % $C_1$ to $C_{30}$ hydrocarbyl group comprising at least one aliphatic unsaturated bond, wherein the curable compositions have a cure speed in Pa/min (the slope of the storage modulus, G', as a function of time, as determined from rheology measuring the increase in G' as a function of temperature) of at least about 1 Pa/min, at least about 2 Pa/min, at least about 4 Pa/min, at least about 10 Pa/min or at least about 20 Pa/min at a heating rate of 5° C./min, e.g., from about 1 Pa/min to about 10 Pa/min, from about 1 Pa/min to about 20 Pa/min, from about 1 Pa/min to about 6 Pa/min, from about 2 Pa/min to about 6 Pa/min, from about 1 Pa/min to about 100 Pa/min, from about 5 Pa/min to about 50 Pa/min; from about 10 Pa/min to about 100 Pa/min; from about 20 Pa/min to about 80 Pa/min; from about 20 Pa/min to about 60 Pa/min; from about 50 Pa/min to about 100 Pa/min; or from about 30 Pa/min to about 90 Pa/min at a heating rate of 5° C./min.

Solid Resin-Linear Organosiloxane Block Copolymer Compositions

Solid compositions containing the resin-linear organosiloxane block copolymers of the embodiments of the present invention, may be prepared by removing some or substantially all the solvent from the curable organosiloxane block copolymer compositions as described herein. The solvent may be removed by any known processing techniques. In one embodiment, a film of the curable compositions containing the organosiloxane block copolymers is formed, and the solvent is allowed to evaporate from the film. Subjecting the films to elevated temperatures, and/or reduced pressures, may accelerate solvent removal and subsequent formation of the solid curable composition. Alternatively, the curable compositions may be passed through an extruder to remove solvent and provide the solid composition in the form of a ribbon or pellets. Coating operations against a release film could also be used as in slot die coating, knife over roll, rod, or gravure coating. Also, roll-to-roll coating operations could be used to prepare a solid film. In coating operations, a conveyer oven or other means of heating and evacuating the solution can be used to drive off the solvent and obtain the final solid film.

Although not wishing to be bound by any theory, it is possible that the structural ordering of the disiloxy and trisiloxy units in the organosiloxane block copolymer, as described herein, may provide the copolymer with certain unique physical property characteristics when solid compositions of the block copolymer are formed. For example, the structural ordering of the disiloxy and trisiloxy units in the copolymer may provide solid coatings that allow for a high optical transmittance of visible light (e.g., at wavelengths above 350 nm). The structural ordering may also allow the organosiloxane block copolymer to flow and cure upon heating, yet remain stable at room temperature. They may also be processed using lamination techniques. These properties are useful to provide coatings for various electronic articles to improve weather resistance and durability, while providing low cost and easy procedures that are energy efficient. Finally, the structural ordering of the disiloxy and trisiloxy units in the copolymer may influence, among other things, the glass transition temperature $T_g$, such that the copolymer has a high $T_g$ phase; the tack such that the copolymer has low tack; the strength of the copolymer, as evidenced by, among other things, the tensile strength; and shelf stability.

In some embodiments, the aforementioned organosiloxane block copolymers are isolated in a solid form, for example by casting films of a solution of the block copolymer in an organic solvent (e.g., benzene, toluene, xylene or combinations thereof) and allowing the solvent to evaporate. Under these conditions, the aforementioned organosiloxane block copolymers can be provided as solutions in an organic solvent containing from about 50 wt % to about 80 wt % solids, e.g., from about 60 wt % to about 80 wt %, from about 70 wt % to about 80 wt % or from about 75 wt % to about 80 wt % solids. In some embodiments, the solvent is toluene. In some embodiments, such solutions may have a viscosity of from about 1500 cSt to about 10000 cSt at 25° C., e.g., from about 1500 cSt to about 3000 cSt, from about 2000 cSt to about 4000 cSt, from about 2000 cSt to about 3000 cSt, from about 2000 cSt to about 8000 cSt, from about 5000 cSt to about 10000 cSt or from about 8000 cSt to about 10000 cSt at 25° C.

In some embodiments, the cured product of the curable compositions containing the resin-linear organosiloxane block copolymers of the embodiments of the present invention has a Young's modulus after aging for 50 hours at 225° C. that is not substantially different from the Young's modulus before aging for 50 hours at 225° C. In some embodiments, the ratio of the Young's Modulus after aging for 50 hours at 225° C. to the Young's modulus before aging is 3 or less (e.g., about 2.5 or less, about 2.0 or less, or about 1.5 or less; or about 1 to about 2.5, from about 1.25 to about 2, from about 1.5 to about 1.8 or from about 1.4 to about 2.25 after aging, it being understood that if the ratio is 1, the Young's modulus before and after aging is the same).

In some embodiments, the cured product of the curable compositions containing the resin-linear organosiloxane block copolymers of the embodiments of the present invention has a Young's modulus after aging for 30 hours at 225° C. that is not substantially different from the Young's modulus before aging for 30 hours at 225° C. In some embodiments, the Young's Modulus after aging for 30 hours at 225° C. compared to the Young's modulus before aging is 1.5 or less (e.g., about 1.4 or less, about 1.3 or less, or about 1.2 or less after aging; or from about 0 to about 1.5, from about 0.5 to about 1.5, from about 1.0 to about 1.5, or from about 1.0 to about 1.5 after aging, it being understood that if the ratio is 1, the Young's modulus before and after aging is the same).

In some embodiments, the cured product of the curable compositions containing the resin-linear organosiloxane block copolymers of the embodiments of the present invention has a Young's Modulus before aging for 30 or 50 hours at 225° C. of from about 70 MPa to about 200 MPa before aging (e.g., from about 70 MPa to 100 MPa, from about 100 MPa to about 150 MPa, from about 120 MPa to about 180 MPa, from about 150 MPa to about 180 MPa or from about 130 MPa to about 180 MPa).

In some embodiments, the Young's modulus after aging for 30 hours at 225° C. does not change substantially. If the Young's modulus does change after aging for 30 hours at 225° C., the Young's modulus after aging is from about 100 MPa to about 250 MPa (e.g., from about 100 MPa to about 150 MPa, from about 150 MPa to about 180 MPa, from about 130 MPa to 180 MPa, from about 100 MPa to about 140 MPa or from about 140 MPa to about 180 MPa) after aging for 30 hours at 225° C.

In some embodiments, the Young's modulus after aging for 50 hours at 225° C. does not change substantially. If the Young's modulus does change after aging for 50 hours at 225° C., the Young's modulus after aging is from about 130 MPa to about 250 MPa (e.g., from about 130 MPa to about 200 MPa, from about 150 MPa to about 250 MPa, from about 180 MPa to 240 MPa, from about 150 MPa to about 240 MPa or from about 180 MPa to about 250 MPa) after aging for 50 hours at 225° C.

In some embodiments, the cured product of the curable compositions containing the resin-linear organosiloxane block copolymers of the embodiments of the present invention may be cured in the absence of a condensation catalyst. In other embodiments, the cured product of the curable compositions containing the resin-linear organosiloxane block copolymers of the embodiments of the present invention the product cures and is cured in the presence of a phosphor or a filler. Representative examples of suitable phosphors and fillers may be found in PCT Appl. No. PCT/US2013/031253.

Upon drying or forming a solid, the non-linear blocks of the block copolymer further aggregate together to form "nano-domains." As used herein, "predominately aggregated" means the majority (e.g., greater than 50%; greater than 60%; greater than 75%, greater than 80%, greater than 90%; from about 75% to about 90%, from about 80% to about 90%, or from about 75% to about 85%) of the non-linear blocks of the organosiloxane block copolymer are found in certain regions of the solid composition, described herein as "nano-domains." As used herein, "nano-domains" refers to those phase regions within the solid block copolymer compositions that are phase separated within the solid block copolymer compositions and possess at least one dimension sized from 1 to 100 nanometers. The nano-domains may vary in shape, providing at least one dimension of the nano-domain is sized from 1 to 100 nanometers. Thus, the nano-domains may be regular or irregularly shaped. The nano-domains may be spherically shaped, tubular shaped, and, in some instances, lamellar shaped.

In a further embodiment, the solid organosiloxane block copolymers as described herein contain a first phase and an incompatible second phase, the first phase containing predominately the disiloxy units $[R^1_2SiO_{2/2}]$ as defined herein, the second phase containing predominately the trisiloxy units $[R^2SiO_{3/2}]$ as defined herein, the non-linear blocks being sufficiently aggregated into nano-domains which are incompatible with the first phase.

In some embodiments, the resin-linear organosiloxane block copolymers of the embodiments of the present invention may contain an organosiloxane resin (e.g., free resin that is not part of the block copolymer). In this example, the organosiloxane resin also predominately aggregates within the nano-domains. In some embodiments, the free resin is present in an amount of from about 5 to about 30 wt. %, preferably from about 10 to about 30 wt. %.

The structural ordering of the disiloxy and trisiloxy units in the solid block copolymers of the present disclosure, and characterization of the nano-domains, may be determined explicitly using certain analytical techniques such as Transmission Electron Microscopic (TEM) techniques, Atomic Force Microscopy (AFM), Small Angle Neutron Scattering, Small Angle X-Ray Scattering, and Scanning Electron Microscopy.

Alternatively, the structural ordering of the disiloxy and trisiloxy units in the block copolymer, and formation of nano-domains, may be implied by characterizing certain physical properties of coatings resulting from the present organosiloxane block copolymers. For example, the present organosiloxane copolymers may provide coatings that have an optical transmittance of visible light greater than 95%. One skilled in the art recognizes that such optical clarity is possible (other than refractive index matching of the two phases) only when visible light is able to pass thorough such a medium and not be diffracted by particles (or domains as used herein) having a size greater than 150 nanometers. As the particle size, or domains further decreases, the optical clarity may be further improved. Thus, coatings or encapsulants derived from the present organosiloxane copolymers may have an optical transmittance of visible light of at least 95%, e.g., at least 96%; at least 97%; at least 98%; at least 99%; or 100% transmittance of visible light at a coating or encapsulant or film film thickness of 0.5 mm or greater. As used herein, the term "visible light" includes light with wavelengths above 350 nm.

Some of the embodiments of the present invention relate to optical assemblies and articles comprising the compositions described herein such as those described in Published PCT Application Nos. WO2013/101674, filed Dec. 20, 2012; WO2013/109607, filed Jan. 16, 2013; and WO2013/119796, filed Feb. 7, 2013, all of which are incorporated by reference as if fully set forth herein. Accordingly, some embodiments of the present invention relate to an LED encapsulant comprising an organosiloxane block copolymer described herein.

The term "about," as used herein, can allow for a degree of variability in a value or range, for example, within 10%, within 5%, or within 1% of a stated value or of a stated limit of a range.

Values expressed in a range format should be interpreted in a flexible manner to include not only the numerical values explicitly recited as the limits of the range, but also to include all the individual numerical values or sub-ranges encompassed within that range as if each numerical value and sub-range were explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range.

Embodiments of the invention described and claimed herein are not to be limited in scope by the specific embodiments herein disclosed, since these embodiments are intended as illustration of several aspects of the disclosure. Any equivalent embodiments are intended to be within the scope of this disclosure. Indeed, various modifications of the embodiments in addition to those shown and described herein will become apparent to those skilled in the art from the foregoing description. Such modifications are also intended to fall within the scope of the appended claims.

The Abstract is provided to allow the reader to quickly ascertain the nature of the technical disclosure. It is submitted with the understanding that it will not be used to interpret or limit the scope or meaning of the claims.

EXAMPLES

The following examples are included to demonstrate specific embodiments of the invention. However, those of skill in the art should, in light of the present disclosure, appreciate that many changes can be made in the specific embodiments which are disclosed and still obtain a like or similar result without departing from the spirit and scope of the invention. All percentages are in wt %. All measurements were conducted at 23° C. unless indicated otherwise.

Example 1: Representative Preparation of Resin-Linear (RL) Block Copolymers

A 12 L 3-neck round bottom flask was charged with phenyl-T resin (1800 g, 13.18 moles Si, Dow Corning 217 flake) and toluene (1482 g) under nitrogen. The flask was equipped with a thermometer, Teflon stir paddle, and a Dean Stark apparatus attached to a water-cooled condenser (Dean Stark was prefilled with toluene). The reaction mixture was heated at reflux for 30 minutes with 8.18 g water removed. The reaction solution was cooled to 108° C., followed by quickly adding MTA/ETA (methyltriacetoxysilane/ethyltriacetoxysilane) capped silanol terminated PhMe siloxane (which was synthesized by adding 50/50 wt % MTA/ETA (methyltriacetoxysilane/ethyltriacetoxysilane) (46.96 g, 0.207 moles Si) to the siloxane (2200 g, 16.13 moles Si, DP=127; wherein "DP" stands for degree of polymerization as determined from NMR) and stirring them at room temperature in a glove box for 1 hour). The reaction mixture was heated at reflux for 2 hours under nitrogen with 14.66 g water removed. The reaction solution was cooled to 108° C. again and charged with 50/50 wt % MTA/ETA (methyltriacetoxysilane/ethyltriacetoxysilane) (314.49 g, 1.348 moles), followed by refluxing for 1 hour with 0.56 g water removed, and then the reaction mixture was cooled to 90° C. and added with deionized (DI) water (430 g), followed by refluxing to remove water via azeotropic distillation. The adding-removing water process was repeated two times with a total 1045.9 g aqueous phase removed. Finally the solid content of the solution was increased to about 70 wt. % by distilling and removing some volatiles (1331.4 g) at 118° C. The synthesized RL solution was clear and colorless, and stored at room temperature for future use.

Example 2: Preparation of $M^{Vi}$ Resin-Linear Block Copolymers Having 3.5 Mole % Vi A 1 L dry 3-neck round bottom flask was charged with a solution of the resin-linear block copolymer made according to Example 1 (100 g, 0.77 moles Si, 0.138 moles silanol) in toluene (150 g) and triethylamine (TEA, 5.76 mL, 0.0414 moles) under nitrogen, followed by stirring for 10 minutes. Vinyldimethylchlorosilane (5.7 mL, 0.0414 moles) was slowly added to the flask by a syringe within 10 minutes. White salt precipitates were formed within 1 minute after adding the chlorosilane. The reaction mixture was stirred under nitrogen and room temperature for 3 hours, followed by adding 1 mL DI water to quenching the unreacted chlorosilane. Finally 5 g anhydrous $Na_2SO_4$ was added to the flask, followed by stirring under air overnight to completely dry the solution. In second day, the reaction solution was filtered with 1.2 μm filter paper under 20 psi to remove the white salt precipitates. The solvent and small amount of TEA and quenched vinyl precursors were removed completely by using Rotavapor at 80° C. and 5 mm Hg vacuum. The $M^{Vi}RL$ product is soft colorless gum-like materials containing 3.5 mole % Vi and can re-dissolve in toluene.

Example 3: Preparation of $M^{Vi}$-Modified Resin-Linear Block Polymers Having 2 Mole % Vi (i) Preparation of $M^{Vi}_{0.045}T^{Ph}_{0.955}$ resin: A 3 L 3-neck round bottom flask was loaded DI water (1011.9 g), followed by cooling to 4° C. with ice-water bath. The flask was equipped with a thermometer, Teflon stir paddle, and a water-cooled condenser. A pre-mixed solution of phenyltrichlorosilane (500.5 g, 2.366 moles), vinyldimethylchlorosilane (15.03 g, 0.125 moles) and toluene (494.4 g) was added to the cooled water within 2 minutes, followed by stirring for 5 minutes with the removal of ice-water bath (the maximum temperature of the solution was up to 74° C. during the reaction). The reaction mixture was transferred into a 2 L round bottom flask with a bottom drain and then the aqueous layer was removed. DI water (82.4 g) was added to the remained materials, followed by heating at 80° C. for 10 minutes and then cooling down and removing the aqueous phase. The remained materials was added by a mixture of 2-propanol (20.6 g) and DI water (61.8 g), followed by heating at 80° C. for 10 minutes and removing aqueous phase, repeating this step for several times until the final wash water phase had a pH of 4.0. The reaction mixture was then heated at reflux to remove residual water via azeotropic distillation. The synthesized $M^{Vi}_{0.045}T^{Ph}_{0.955}$ resin was dried by using a rotavapor at 120° C. The $M^{Vi}_{0.045}T^{Ph}_{0.955}$ product was a "crunchy" solid at room temperature with the yield of 314 g, containing 4.5 mole % Vi.

(ii) Preparation of $M^{Vi}RLs$ (2 mole % Vi): A 500 mL 4-neck round bottom flask was charged with $M^{Vi}_{0.045}T^{Ph}_{0.955}$ resin (72 g, 0.541 moles Si) and toluene (59.3 g) under nitrogen. The flask was equipped with a thermometer, Teflon stir paddle, and a Dean Stark apparatus attached to a water-cooled condenser (Dean Stark was prefilled with toluene). The reaction mixture was heated at reflux for 30 minutes with 0.01 g water removed. The reaction solution was cooled to 108° C., followed by quickly adding MTA/ETA (methyltriacetoxysilane/ethyltriacetoxysilane) capped silanol terminated PhMe siloxane (which was synthesized by adding MTA/ETA (50/50, 1.85 g, 0.00813 moles Si) to the siloxane (88 g, 0.645 moles Si, DP=129) and stirring them at room temperature in a glove box for 1 hour). The reaction mixture was heated at reflux for 2 hours under nitrogen with 0.65 g water removed. The reaction solution was cooled to 108° C. again and charged with MTA/ETA (50/50, 4.92 g, 0.0216 moles Si), followed by refluxing for 1 hour with 0.25 g water removed, and then the reaction mixture was cooled to 90° C. and added with DI water (8.05 g), followed by refluxing to remove water via azeotropic distillation. The adding-removing water was repeated three times. Finally the solid content of the solution was increased to about 70 wt. % by distilling and removing some volatiles (39.2 g) at 118° C. The synthesized $M^{Vi}RLs$ solution was clear and colorless, and contains 2 mole % Vi.

Example 4: Preparation of $M^{Vi}$-Modified Resin-Linear Block Polymers Having 3.7 Mole % Vi (i) Preparation of $M^{Vi}_{0.078}T^{Ph}_{0.922}$ resin: A 3 L 3-neck round bottom flask was loaded DI water (1011.9 g), followed by cooling to 4° C. with ice-water bath. The flask was equipped with a thermometer, Teflon stir paddle, and a water-cooled condenser. A pre-mixed solution of phenyltrichlorosilane (500.5 g, 2.366 moles), vinyldimethylchlorosilane (26.55 g, 0.22 moles) and toluene (508.5 g) was added to the cooled water within 2 minutes, followed by stirring for 5 minutes with the removal of ice-water bath (the maximum temperature of the solution was up to 71° C. during the reaction). The reaction mixture was transferred into a 2 L round bottom flask with a bottom drain and then the aqueous layer was removed. DI water (84.8 g) was added to the remained materials, followed by heating at 80° C. for 10 minutes and then cooling down and removing the aqueous phase. The remained materials was added by a mixture of 2-propanol (21.2 g) and DI water (63.6 g), followed by heating at 80° C. for 10 minutes and removing aqueous phase, repeating this step for several times until the final wash water phase had a pH of 4.0. The reaction mixture was then heated at reflux to remove residual water via azeotropic distillation. The synthesized $M^{Vi}T^{Ph}$ resin was dried by using a rotavapor at 120° C. The product was a crunchy solid at room temperature with the yield of 332 g, containing 7.8 mole % Vi.

(ii) Preparation of $M^{Vi}RLs$ (3.7 mole % Vi): A 500 mL 4-neck round bottom flask was charged with $M^{Vi}_{0.078}T^{Ph}_{0.922}$ resin (72 g, 0.547 moles Si) and toluene (59.3 g) under nitrogen. The flask was equipped with a thermometer, Teflon stir paddle, and a Dean Stark apparatus attached to a water-cooled condenser (Dean Stark was prefilled with toluene). The reaction mixture was heated at reflux for 30 minutes with 0.05 g water removed. The reaction solution was cooled to 108° C., followed by quickly adding MTA/ETA capped silanol terminated PhMe siloxane (which was synthesized by adding MTA/ETA (50/50, 1.85 g, 0.00813 moles Si) to the siloxane (88 g, 0.645 moles Si, DP=129) and stirring them at room temperature in a glove box for 1 hour. The reaction mixture was heated at reflux for 2 hours under nitrogen with 0.7 g water removed. The reaction solution was cooled to 108° C. again and charged with MTA/ETA (50/50, 4.98 g, 0.0219 moles Si), followed by refluxing for 1 hour with 0.3 g water removed, and then the reaction mixture was cooled to 90° C. and added with DI water (8.12 g), followed by refluxing to remove water via azeotropic distillation. The adding-removing water was repeated for three times. Finally the solid content of the solution was increased to about 70 wt. % by distilling and removing some volatiles (38.4 g) at 118° C. The synthesized $M^{Vi}RLs$ solution was clear and colorless, and contains 3.7 mole % Vi.

Example 5: Preparation of $D^{Vi}$-Modified Resin-Linear Block Polymers Having 3.7 Mole % Vi (i) Preparation of $D^{Vi}_{0.08}T^{Ph}_{0.92}$ resin: A 3 L 3-neck round bottom flask was loaded DI water (1011.9 g), followed by cooling to 4° C. with ice-water bath. The flask was equipped with a thermometer, Teflon stir paddle, and a water-cooled condenser. A pre-mixed solution of phenyltrichlorosilane (500.5 g, 2.366 moles), vinylmethyldichlorosilane (31.04 g, 0.22 moles) and toluene (506.1 g) was added to the cooled water within 2 minutes, followed by stirring for 5 minutes with the removal of ice-water bath (the maximum temperature of the solution was up to 75° C. during the reaction). The reaction mixture was transferred into a 2 L round bottom flask with a bottom drain and then the aqueous layer was removed. DI water (84.8 g) was added to the remained materials, followed by heating at 80° C. for 10 minutes and then cooling down and removing the aqueous phase. The remained materials was added by a mixture of 2-propanol (21.2 g) and DI water (63.6 g), followed by heating at 80° C. for 10 minutes and removing aqueous phase, repeating this step for several times until the final wash water phase had a pH of 4.0. The reaction mixture was then heated at reflux to remove residual water via azeotropic distillation. The synthesized $D^{Vi}T^{Ph}$ resin was dried by using a rotavapor at 120° C. The product was a crunchy solid at room temperature a yield of 335 g, containing 8 mole % Vi.

(ii) Preparation of $D^{Vi}RLs$ (3.7 mole % Vi): A 500 mL 4-neck round bottom flask was charged with $D^{Vi}_{0.08}T^{Ph}_{0.92}$ resin (72 g, 0.55 moles Si) and toluene (59.3 g) under nitrogen. The flask was equipped with a thermometer, Teflon stir paddle, and a Dean Stark apparatus attached to a water-cooled condenser (Dean Stark was prefilled with toluene). The reaction mixture was heated at reflux (113° C.) for 30 minutes with 0.03 g water removed. The reaction solution was cooled to 108° C., followed by quickly adding MTA/ETA capped silanol terminated PhMe siloxane (which was synthesized by adding MTA/ETA (50/50, 1.85 g, 0.00813 moles Si) to the siloxane (88 g, 0.645 moles Si, DP=129) and stirring them at room temperature in a glove box for 1 hour). The reaction mixture was heated at reflux for 2 hours under nitrogen with 0.7 g water removed. The reaction solution was cooled to 108° C. again and charged with MTA/ETA (50/50, 1.25 g, 0.0055 moles Si), followed by refluxing for 1 hour with 0.27 g water removed, and then the reaction mixture was cooled to 90° C. and added with DI water (7.37 g), followed by refluxing to remove water via azeotropic distillation. The adding-removing water was repeated for three times. Finally the solid content of the solution was increased to about 70 wt. % by distilling and removing some volatiles (38.3 g) at 118° C. The synthesized $D^{Vi}RLs$ solution was clear and colorless, and contains 3.7 mole % Vi.

Example 6: Preparation of $D^{Vi}$-Modified Resin-Linear Block Polymers Having 3.5 Mole % Vi A 500 mL 4-neck round bottom flask was charged with phenyl-T resin (72 g, 0.527 moles Si, Dow Corning 217 Flake) and toluene (59.3 g) under nitrogen. The flask was equipped with a thermometer, Teflon stir paddle, and a Dean Stark apparatus attached to a water-cooled condenser (Dean Stark was prefilled with toluene). The reaction mixture was heated at reflux (113° C.) for 30 minutes with 0.1 g water removed. The reaction solution was cooled to 108° C., followed by quickly adding MTA capped silanol terminated PhMe siloxane (which was synthesized by adding MTA (methyltriacetoxysilane, 1.79 g, 0.00813 moles Si) to the siloxane (88 g, 0.645 moles Si, DP=129) and stirring them at room temperature in a glove box for 1 hour). The reaction mixture was heated at reflux for 2 hours under nitrogen with 0.95 g water removed. The reaction solution was cooled to 108° C. again and charged with VMDA (vinylmethyldiacetoxysilane, 8.14 g, 0.0432 moles Si), followed by refluxing for 1 hour with 0.65 g water removed, and then the reaction mixture was cooled to 90° C. and added with DI water (17.14 g), followed by refluxing to remove water via azeotropic distillation. The reaction solution was cooled to 108° C. again and added with MTA (2.67 g, 0.0121 moles Si), followed by refluxing for 1 hour, and then the reaction mixture was cooled to 90° C. and added with DI water (17.14 g), followed by refluxing to remove water via azeotropic distillation (this adding-removing water was repeated for two times). Finally the solid content of the solution was increased to about 70 wt. % by distilling and removing some volatiles (36.5 g) at 118° C. The synthesized $D^{Vi}RLs$ solution was clear and colorless, and contains 3.5 mole % Vi.

Example 7: Preparation of $T^{Vi}$-Modified Resin-Linear Block Polymers Having 4.5 Mole % Vi A 500 mL 4-neck round bottom flask was charged with phenyl-T resin (72 g, 0.527 moles Si, Dow Corning 217 Flake) and toluene (59.3 g) under nitrogen. The flask was equipped with a thermometer, Teflon stir paddle, and a Dean Stark apparatus attached to a water-cooled condenser (Dean Stark was prefilled with toluene). The reaction mixture was heated at reflux (113° C.) for 30 minutes with 0.1 g water removed. The reaction solution was cooled to 108° C., followed by quickly adding MTA capped silanol terminated PhMe siloxane (which was synthesized by adding MTA/ETA (50/50, 1.85 g, 0.00813 moles Si) to the siloxane (88 g, 0.645 moles Si, DP=129) and stirring them at room temperature in a glove box for 1 hour. The reaction mixture was heated at reflux for 2 hours under nitrogen with 0.94 g water removed. The reaction solution was cooled to 108° C. again and charged with VTA (vinyltriacetoxysilane, 12.84 g, 0.0553 moles Si), followed by refluxing for 1 hour with 0.71 g water removed, and then the reaction mixture was cooled to 90° C. and added with DI water (17.14 g), followed by refluxing to remove water via azeotropic distillation. The adding-removing water was repeated for three times with total 59.1 g water removed. Finally the solid content of the solution was increased to about 70 wt. % by distilling and removing some volatiles (38.6 g) at 118° C. The synthesized $T^{Vi}RLs$ solution was clear and colorless, and contains 4.5 mole % Vi.

Example 8: Preparation of $D^{Vi}$-Modified Resin-Linear Block Polymers Having 1 Mole % Vi A 500 mL 4-neck round bottom flask was charged with phenyl-T resin (72 g, 0.535 moles Si, Dow Corning 217 Flake) and toluene (59.3 g) under nitrogen. The flask was equipped with a thermometer, Teflon stir paddle, and a Dean Stark apparatus attached to a water-cooled condenser (Dean Stark was prefilled with toluene). The reaction mixture was heated at reflux (113° C.) for 30 minutes with 0.01 g water removed. The reaction solution was cooled to 108° C., followed by quickly adding MTA capped silanol terminated PhMe siloxane (which was synthesized by adding MTA (methyltriacetoxysilane, 1.79 g, 0.00813 moles Si) to the siloxane (88 g, 0.645 moles Si, DP=129) and stirring them at room temperature in a glove box for 1 hour). The reaction mixture was heated at reflux for 2 hours under nitrogen with 0.67 g water removed. The reaction solution was cooled to 108° C. again and charged with VMDA (vinylmethyldiacetoxysilane, 2.33 g, 0.0124 moles Si), followed by refluxing for 1 hour with 0.24 g water removed, and then the reaction mixture was cooled to 90° C. and added with DI water (14 g), followed by refluxing to remove water via azeotropic distillation. The reaction solution was cooled to 108° C. again and added with MTA (1.77 g, 0.00804 moles Si), followed by refluxing for 1 hour, and then the reaction mixture was cooled to 90° C. and added with DI water (15.4 g), followed by refluxing to remove water via azeotropic distillation (this adding-removing water was repeated for two times). Finally the solid content of the solution was increased to about 70 wt. % by distilling and removing some volatiles (31.5 g) at 118° C. The synthesized $D^{Vi}RLs$ solution was clear and colorless, and contains 1 mole % Vi.

Example 9: Preparation of $D^{Vi}$-Modified Resin-Linear Block Polymers Having 2 Mole % Vi A 500 mL 4-neck round bottom flask was charged with phenyl-T resin (180 g, 1.318 moles Si, Dow Corning 217 Flake) and toluene (138.6 g) under nitrogen. The flask was equipped with a thermometer, Teflon stir paddle, and a Dean Stark apparatus attached to a water-cooled condenser (Dean Stark was prefilled with toluene). The reaction mixture was heated at reflux for 30 minutes with 0.54 g water removed. The reaction solution was cooled to 108° C., followed by quickly adding MTA/ETA capped silanol terminated PhMe siloxane (which was synthesized by adding 50/50 MTA/ETA (methyltriacetoxysilane/ethyltriacetoxysilane, 4.24 g, 0.0187 moles Si) to the siloxane (220 g, 1.614 moles Si, DP=181) and stirring them at room temperature in a glove box for 1 hour). The reaction mixture was heated at reflux for 2 hours under nitrogen with 2.01 g water removed. The reaction solution was cooled to 108° C. again and charged with VMDA (vinylmethyldiacetoxysilane, 11.91 g, 0.0633 moles Si), followed by refluxing for 1 hour with 1.05 g water removed, and then the reaction mixture was cooled to 90° C. and added with DI water (47.8 g), followed by refluxing to remove water via azeotropic distillation. The reaction solution was cooled to 108° C. again and added with 50/50 MTA/ETA (21.57 g, 0.0949 moles Si), followed by refluxing for 1 hour, and then the reaction mixture was cooled to 90° C. and added with DI water (47.8 g), followed by refluxing to remove water via azeotropic distillation (this adding-removing water was repeated for two times). Same water treatment was performed three times, and finally the solid content of the solution was increased to about 70 wt. % by distilling and removing some volatiles (103.6 g) at 118° C. The synthesized $D^{Vi}RLs$ solution was clear and colorless, and contains 2 mole % Vi.

Example 10: $D^{Vi}RLs$ with 2 Mole % Vi and 1 Ppm Pt Catalysts $D^{Vi}RL$ in Example 9 was used to prepare example 10 with the loading of 1 ppm Pt catalysts.

Example 11: $T^{Vi}RLs$ with 2 Mole % Vi

A 500 mL 4-neck round bottom flask was charged with phenyl-T resin (180 g, 1.318 moles Si, Dow Corning 217 Flake) and toluene (148.2 g) under nitrogen. The flask was equipped with a thermometer, Teflon stir paddle, and a Dean Stark apparatus attached to a water-cooled condenser (Dean Stark was prefilled with toluene). The reaction mixture was heated at reflux for 30 minutes with 1.05 g water removed. The reaction solution was cooled to 108° C., followed by quickly adding MTA/ETA capped silanol terminated PhMe siloxane (which was synthesized by adding 50/50 MTA/ETA (methyltriacetoxysilane/ethyltriacetoxysilane, 4.43 g, 0.0195 moles Si) to the siloxane (220 g, 1.614 moles Si, DP=181) and stirring them at room temperature in a glove box for 1 hour). The reaction mixture was heated at reflux for 2 hours under nitrogen with 2.05 g water removed. The reaction solution was cooled to 108° C. again and charged with VTA (vinyltriacetoxysilane, 14.29 g, 0.0615 moles Si) and 50/50 MTA/ETA (14.48 g, 0.0637 moles Si), followed by refluxing for 1 hour, and then the reaction mixture was cooled to 90° C. and added with DI water (39.1 g), followed by refluxing to remove water via azeotropic distillation. Water treatment (39.1 g DI water) was repeated for two more times. Finally the solid content of the solution was increased to about 70 wt. % by distilling and removing some volatiles (113 g) at 118° C. The synthesized $D^{Vi}RLs$ solution was clear and colorless, and contains 2 mole % Vi.

Example 12: Hydrosilylation Cure Formulations

Hydrosilylation cure formulations containing resin-linear organosiloxane block copolymers made according to Examples 2-11 were prepared to contain the amounts of resin linear organosiloxane block copolymer, compounds having the formula $R^1_q R^3_{(3-q)}SiO(R^1_2 SiO_{2/2})_m SiR^3_{(3-q)}R^1_q$, and Pt catalyst shown in Table 2. The resin-linear organosiloxane block copolymer was prepared as a 60 wt. % solution in toluene, followed by pouring the solution into a Teflon coated aluminum pan to make 0.5 to 2 mm thick films. The transparent, solid, uncured film was formed evenly in the aluminum pan after leaving the pan in hood overnight to remove the solvent toluene. The pan containing the solid film was heated in oven at 70° C. for several hours, then at 120° C. for 1 hour, and finally at 160° C. for 3 hours to obtain the cured film.

Comparative Example 1

A 12 L 3-neck round bottom flask was charged with phenyl-T resin (1800 g, 13.18 moles Si, Dow Corning 217 flake) and toluene (1482 g) under nitrogen. The flask was equipped with a thermometer, Teflon stir paddle, and a Dean Stark apparatus attached to a water-cooled condenser (Dean Stark was prefilled with toluene). The reaction mixture was heated at reflux for 30 minutes with 8.18 g water removed. The reaction solution was cooled to 108° C., followed by quickly adding MTA/ETA (methyltriacetoxysilane/ethyltriacetoxysilane) capped silanol terminated PhMe siloxane (which was synthesized by adding 50/50 wt % MTA/ETA (methyltriacetoxysilane/ethyltriacetoxysilane) (46.96 g, 0.207 moles Si) to the siloxane (2200 g, 16.13 moles Si, DP=127) and stirring them at room temperature in a glove box for 1 hour). The reaction mixture was heated at reflux for 2 hours under nitrogen with 14.66 g water removed. The reaction solution was cooled to 108° C. again and charged with 50/50 wt % MTA/ETA (methyltriacetoxysilane/ethyltriacetoxysilane) (314.49 g, 1.348 moles), followed by refluxing for 1 hour with 0.56 g water removed, and then the reaction mixture was cooled to 90° C. and added with deionized (DI) water (430 g), followed by refluxing to remove water via azeotropic distillation. The adding-removing water process was repeated two times with a total 1045.9 g aqueous phase removed. Finally the solid content of the solution was increased to about 70 wt. % by distilling and removing some volatiles (1331.4 g) at 118° C. The synthesized resin-linear solution was clear and colorless. The resin-linear block copolymer was cured in the presence of 50 ppm DBU to give DBU cured resin-linear solid compositions.

Comparative Example 2

The resin linear solution was synthesized using the same procedures given in Comparative Example 1. The resin-linear block copolymer was cured in the presence of Al(acac)$_3$ containing 100 ppm Al for preparing Al cured resin-linear solid compositions.

Comparative Example 3

The components set forth below are mixed using a vacuum planetary mixer, Thinky ARV-310, for 2 minutes at 1600 rpm under 2 kPa to form a liquid composition:
Component 1: Average Unit Molecular Formula: (Me$_2$ViSiO$_{1/2}$)$_{0.25}$(PhSiO$_{3/2}$)$_{0.75}$; 5.8 g;
Component 2: Average Unit Molecular Formula: Me$_2$ViSiO(MePhSiO)$_{25}$OSiMe$_2$Vi; 1.8 g;
Component 3: Average Unit Molecular Formula: HMe$_2$SiO(Ph$_2$SiO)SiMe$_2$H; 2.0 g;
Component 4: Average Unit Molecular Formula: (HMe$_2$SiO) 1/2/0.60(PhSiO$_{3/2}$)$_{0.4}$; 0.24 g;
Component 5: Average Unit Molecular Formula: (Me$_2$ViSiO$_{1/2}$)$_{0.18}$ (PhSiO$_{3/2}$)$_{0.54}$(EpMeSiO)$_{0.28}$ wherein (Ep=glicidoxypropyl); 0.23 g;
Component 6: Average Unit Molecular Formula: Cyclic (ViSiMeO$_{1/2}$)$_n$; 0.02 g;
1-Ethynyl-1-Cyclohexanol, 240 ppm; and
Pt Catalyst (1,3-divinyltetramethylsiloxane complex), 2.5 ppm.

Comparative Example 4

Preparation of $M^{Vi}$-Modified Resin-Linear Block Polymers Having 2.7 Mole % Vi Via Hydrosylilation Reaction (i) Preparation of $M^{Vi}_{0.147}T^{Ph}_{0.853}$ resin: A 3 L 3-neck round bottom flask was loaded DI water (1011.9 g), followed by cooling to 4° C. with ice-water bath. The flask was equipped with a thermometer, Teflon stir paddle, and a water-cooled condenser. A pre-mixed solution of phenyltrichlorosilane (444.26 g, 2.1 moles), vinyldimethylchlorosilane (48.26 g, 0.4 moles) and toluene (481.5 g) was added to the cooled water over 3 minutes (the maximum temperature of the solution was up to 71° C. during the reaction), followed by immediately removing ice-water bath and heating to 80° C. for 15 minutes. The reaction mixture was transferred into a 2 L round bottom flask with a bottom drain, and the aqueous layer was removed, followed by heating at 80° C. for 15 minutes again to promote molecular weight growth. DI water (80.25 g) was added to the remained materials, followed by heating at 80° C. for 10 minutes and then cooling down and removing the aqueous phase. The remained materials was added by a mixture of 2-propanol (20.06 g) and DI water (60.19 g), followed by heating at 80° C. for 10 minutes and removing aqueous phase (repeating this step for several times until the final wash water phase had a pH of 4.0. The reaction mixture was then heated at reflux to remove residual water via azeotropic distillation. The synthesized $M^{Vi}_{0.147}T^{Ph}_{0.853}$ resin was dried by using a rotavapor at 120° C. The product was a "crunchy" solid at room temperature with the yield of 332 g, containing 14.7 mole % Vi.

(ii) Preparation of SiH terminated PhMe siloxane (DP=129, $M^H_2D^{Ph}_{129}$): A 1 L dry 3-neck round bottom flask was charged with silanol terminated PhMe siloxane (D$^{Ph}_{129}$ (OH)$_2$, 300.8 g, 2.207 moles Si, 0.0265 moles silanol), toluene (450 g) and triethylamine (TEA, 4.47 mL, 0.032 moles) under nitrogen, followed by stirring for 10 minutes. dimethylchlorosilane (3.53 mL, 0.0318 moles) was slowly added to the flask by a syringe within 10 minutes. White salt precipitates were formed within 1 minute after adding the chlorosilane. The reaction mixture was stirred under nitrogen and room temperature for 3 hours, followed by adding 1 mL DI water to quench the unreacted cholorsilane. Finally, 10 g anhydrous Na$_2$SO$_4$ was added to the flask, followed by stirring under air overnight to completely dry the solution. In the second day, the reaction solution was filtered with 1.2 μm filter paper under 30 psi to remove the white salt precipitates. The solvent and small amount of TEA and quenched vinyl precursors were removed completely by using Rotavapor at 80° C. and 5 mm Hg vacuum. The $M^H_2D^{Ph}_{129}$ product is clear colorless liquid materials with high viscosity.

(iii) Preparation of $M^{Vi}RLs^{SysD}$ (2.7 mole % Vi): A 500 mL 4-neck round bottom flask was charged with $M^{Vi}_{0.147}T^{Ph}_{0.853}$ resin (72 g, 0.56 moles Si), $M^H_2D^{Ph}_{129}$ (88 g) and toluene (59.3 g) under nitrogen. The flask was equipped with a thermometer, Teflon stir paddle, and a Dean Stark apparatus attached to a water-cooled condenser (Dean Stark was prefilled with toluene). The reaction mixture was heated to 90° C., followed by adding Pt catalyst (TSA-276, 4 g, 2.5 ppm Pt based on total solid weight). The reaction mixture was heated at reflux for 2.5 hours during which samples were taken for IR to monitor the consumption of SiH. The reaction was complete after 2 hour refluxing with 0.63 g water removed. The reaction solution was cooled to 108° C., followed by adding the SiH-terminated siloxane $M^H D^{Ph2} M^H$ (7.46 g, y 0.0224 moles) and refluxing for 2 hours. The reaction was complete after 2 hours with 0.31 g water removed (monitored by IR for SiH). Finally, the solid content of the solution was increased to about 60 wt. % by distilling and removing some volatiles at 118° C. The synthesized 60% $M^{Vi}RLs^{SysD}$ solution was clear, colorless and viscous, and contains 2.7 mole % Vi.

Some physical and chemical characteristics of the resin-linear organosiloxanes made according to Examples 2-11 are given below in Table 1.

TABLE 1

| Resin-linears | Mw (g/mole) | Vi mol % | SiOH mol % |
|---|---|---|---|
| Example 2 | 54063 | 3.5 | 14.5 |
| Example 3 | 69300 | 2 | 18.8 |
| Example 4 | 51481 | 3.7 | 19.3 |
| Example 5 | 66012 | 3.7 | 20.3 |
| Example 6 | 50579 | 3.5 | 18.8 |
| Example 7 | 98949 | 4.5 | 18 |
| Example 8 | 110173 | 1 | 21.2 |
| Example 9 | 89571 | 2 | 18.2 |
| Example 11 | 95722 | 2 | 16.3 |

These novel compositions comprising resin-linear organosiloxanes of the embodiments of the present invention have both vinyl functionality and silanol mol % higher than 1 mole %. This enables both single cure through vinyl, for example using Si—H hydrosilylation, but also dual cure through vinyl/Si—H and SiOH/SiOH condensation, for example.

The cure speed data shown in Table 2 shows that the resin-linear organosiloxane block copolymers made according to Examples 2-11 exhibit cure speeds comparable to the cure speeds observed for resin-linear organosiloxane block copolymers that can only be cured via condensation in the presence of a DBU or Al(acac)$_3$ catalyst. See data for Comparative Examples 1 and 2. Moreover, the resin-linear organosiloxane block copolymers made according to Examples 2-11 all exhibit faster cure speeds than resin linear organosiloxane block copolymers made according to the method described in Comparative Example 2.

The resin-linear organosiloxane block copolymers made according to Examples 2-11 were curable when they contained a phosphor (e.g., Ce:YAG used up to 50 wt. % as compared to total solids). In addition, the resin-linear organosiloxane block copolymers made according to Examples 2-11 all were shelf stable at room temperature (i.e., at 25° C.) and standard pressure (1 atm) for at least 15 weeks, exhibiting a change in the G'$_{min}$ of less than about 50% (e.g., less than about 25%, less than about 20%, less than about 15%, less than about 10%, less than about 5%, less than about 3%, about 0%; from about 0% to about 50%, from about 3% to about 25%, about 5% to about 20% or from about 15% to about 45%) in 15 weeks. In contrast, resin-linear organosiloxane block copolymers made accord-

TABLE 2

| Resin-linear (amount in g) | Compound of the formula $R^1_q R^3_{(3-q)} SiO(R^1_2 SiO_{2/2})_m SiR^3_{(3-q)} R^1_q$ (amount, in mg) | Catalyst (ppm)* | Vi (mol %) | Initial cure temperature (° C.) | Cure speed (Pa/min) at a heating rate of 5° C./min |
|---|---|---|---|---|---|
| Example 2 (20) | $M^H D^{Ph2} M^H$ (931) | Pt (2.5), | 3.5 ($M^{Vi}RL$) | 108 | 4.88 |
| Example 3 (20) | $M^H D^{Ph2} M^H$ (551) | Pt (2.5) | 2 ($M^{Vi}RL$) | 118 | 1.63 |
| Example 4 (20) | $M^H D^{Ph2} M^H$ (972) | Pt (2.5) | 3.7 ($M^{Vi}RL$) | 96 | 1.27 |
| Example 5 (20) | $M^H D^{Ph2} M^H$ (967) | Pt (2.5) | 3.7 ($D^{Vi}RL$) | 116 | 2.73 |
| Example 6 (20) | $M^H D^{Ph2} M^H$ (918) | Pt (2.5) | 3.5 ($D^{Vi}RL$) | 127 | 2.88 |
| Example 7 (20) | $M^H D^{Ph2} M^H$ (1200) | Pt (2.5) | 4.5 ($T^{Vi}RL$) | 148 | 2.23 |
| Example 8 (20) | $M^H D^{Ph2} M^H$ (258) | Pt (2.5) | 1 ($D^{Vi}RL$) | 152 | 1.55 |
| Example 9 (20) | $M^H_{60} T^{Ph}_{40}$ (245) | Pt (2.5) | 2 ($D^{Vi}RL$) | N/A | N/A |
| Example 10 (20) | $M^H_{60} T^{Ph}_{40}$ (245) | Pt (1) | 2 ($D^{Vi}RL$) | N/A | N/A |
| Example 11 (20) | $M^H_{60} T^{Ph}_{40}$ (245) | Pt (2.5) | 2 ($T^{Vi}RL$) | N/A | N/A |
| Comparative Example 1 (20) | | DBU (50) | | 117 | 1.31 |
| Comparative Example 2 (20) | | Al(acac)$_3$ (100, based on total solid wt.)) | | 153 | 1.26 |
| Comparative Example 3 | | Pt (2.5) | N/A | 55 | 1.7 |
| Comparative Example 4 | $M^H D^{Ph2} M^H$ (721) | Pt (2.5) | 2.7 ($M^{Vi}RL$) | 110 | 2.68 |

*Karstedt's catalyst, and contains 2:3 ratio of Pt:vinyl(CH$_3$)$_2$SiOSi(CH$_3$)$_2$vinyl.
[SiH]/[Vi] = 1 for all samples.
"N/A" indicates that the data were not obtained.

ing to Comparative Example 4 exhibited a change in the $G'_{min}$ of over 200% in 15 weeks; and resin-linear organosiloxane block copolymers made according to Comparative Example 3 exhibited a change in the $G'_{min}$ of over 1300% in one week. These results demonstrate that resin-linear organosiloxane block copolymers of the embodiments of the present invention achieve significantly better shelf stability than other materials known in the art that are cured via hydrosilylation. See, e.g., Comparative Example 3.

Color (before and after aging), Young's modulus data (before and after aging), and tan δ data for resin-linear organosiloxane block copolymers made according to Examples 2-11 and Comparative Examples 1-4 are given in Table 3.

In some embodiments, resin-linear organosiloxane block copolymers made according to certain embodiments of the present invention exhibit CIE b* values after aging for 72 h at 235° C. of no more than about 6 (e.g., about 6 or less, about 5 or less, about 4 or less or about 3 or less; or from about 3 to about 6 or from about 4 to about 6).

The data shown in Table 3 also shows that resin-linear organosiloxane block copolymers made according to certain embodiments of the present invention have an acceptably high Young's Modulus at room temperature before aging, and the Young's modulus does not change significantly after aging, such that the resin-linear organosiloxane block copolymers become brittle after aging.

TABLE 3

| Example | Color (CIE b* value) before aging* | Color (CIE b* value) after aging 72 h at 235° C. | Young's Modulus before aging | Young's Modulus after aging 48 h at 225° C. | Tan δ at 200° C. before aging | Tan δ at 200° C. after aging 48 h at 225° C. |
|---|---|---|---|---|---|---|
| Example 2 | 0.54 | 4.375 | 78 | 164 | 0.00997 | 0.0803 |
| Example 3 | 0.52 | 4.814 | 75.6 | 123.1 | 0.117 | N/A |
| Example 4 | 0.49 | 4.289 | 95.2 | 142.2 | 0.0379 | 0.0988 |
| Example 5 | 0.18 | 4.53 | 95.5 | 136.2 | 0.164 | 0.0751 |
| Example 6 | 0.27 | 4.9 | 90 | 143 | 0.0522 | 0.0859 |
| Example 7 | 0.17 | 4.586 | 107.8 | 193.4 | 0.140 | N/A |
| Example 8 | 0.31 | 5.1 | 81.6 | 102 | N/A | N/A |
| Example 9 | 0.6 | 3.6 | 96.8 | 121 | N/A | N/A |
| Example 10 | 0.53 | 3.1 | 91.8 | 111.6 | N/A | N/A |
| Example 11 | 0.58 | 3.8 | 75 | 119.6 | N/A | N/A |
| Comparative Example 1 | 0.27 | 3.8 | 105.9 | 118.8 | 0.182 | 0.121 |
| Comparative Example 2 | 0.4 | 19.8 | 75 | 139.2 | 0.32 | N/A |
| Comparative Example 3 | 0.24 | 12.5 | 14.1 | Too brittle | 0 | 0 |
| Comparative Example 4 | 0.41 | 6.07 | 3.344 | 25.7 | 0.005 | N/A |

*The b* values shown in Table 3 were obtained from samples with thickness of about 1 mm by using BYK Colorimeter.
"N/A" indicates that the data were not obtained.

The data shown in Table 3 show that resin-linear organosiloxane block copolymers made according to certain embodiments of the present invention have a ratio of CIE b* values before and after aging of less than a 10 after aging for 72 h at 235° C. (e.g., a ratio of less than about 9, less than about 8, less than about 7, less than about 6, or less than about 5 after aging 72 h at 235° C.; or a ratio from about a 2 to about a 10, 3 to about 9, or from about a 5 to about 10 after aging for 72 h at 235° C.). Resin-linear organosiloxane block copolymers made according to certain other embodiments of the present invention have a ratio of CIE b* values before and after aging of less than a 30 after aging for 72 h at 235° C. (e.g., less than about a 25, less than about 20 or less than about 15 after aging; or from about a 14-fold to about a 30-fold, 15-fold to about 20-fold, or from about a 20-fold to about a 30-fold change in color after aging for 72 h at 235° C.). In contrast, the resin-linear organosiloxane block copolymers made according to Comparative Examples 2 and 3 exhibit an unacceptable ratio of CIE b* values before and after aging for 72 h at 235° C. of about 50.

TABLE 4

| Example | Type | Vi mol % | $R_{AG'}$ at 23° C. (MPa/hr)* After 500 h aging at 225° C. | CIE b* before aging | CIE b* after 500 h aging at 225° C. |
|---|---|---|---|---|---|
| Example 3 | $D^{Vi}RL$ | 2 | 0.45 | 0.63 | 6.47 |
| Example 9 | $T^{Vi}RL$ | 2 | 0.69 | 0.59 | 8.15 |
| Example 11 | $M^{Vi}RL$ | 2 | 0.49 | 0.71 | 9.72 |

*$R_{AG'}$: the modulus change rate measured at 23° C. before and after 500 hour aging at 225° C.

The data shown in Table 4 shows that resin-linear organosiloxane block copolymers made according to certain embodiments of the present invention shows high thermal stability even after thermally aging at 225° C. for 500 hours. The less modulus change rate and the lower b* value change of $D^{Vi}RL$ after 500 hour aging indicate the benefit of $D^{Vi}RL$ over $M^{Vi}RL$ or $T^{Vi}RL$ in thermal stability.

One significant advantage of resin-linear organosiloxane block copolymers made according to certain embodiments of the present invention is that they are significantly and surprisingly less prone to the elimination of benzene when the T groups comprise phenyl. In some embodiments, resin-linear organosiloxane block copolymers made according to certain embodiments of the present invention generate less than 200 ppm benzene after 30 minutes at 180° C. (e.g., less than 150 ppm, less than 125 ppm, less than 100 ppm, less than 75 ppm, less than 50 ppm, less than 25 ppm, less than 20 ppm, less than 15 ppm, less than 10 ppm, or less than 6 ppm benzene after 30 minutes at 180° C.; or from about 0 ppm to about 200 ppm, from about 10 ppm to about 100 ppm, from about 25 ppm to about 100 ppm, from about 2 to about 20 ppm, from about 10 ppm to about 20 ppm or from about 10 to about 18 ppm benzene after 30 minutes at 180° C.).

Another significant advantage of resin-linear organosiloxane block copolymers made according to certain embodiments of the present invention is that they is that they are significantly and surprisingly less prone to phosphor inhibition after curing relative to resin-linear organosiloxane block copolymers that are cured with typical condensation catalysts, e.g. comparative examples 1 and 2. In addition, the cure speed of the resin-linear organosiloxane block copolymers is much less sensitive to the loading of phosphors, e.g., the initial temperature for cure does not change with the variation of phosphor loading. For example, the initial temperature of cure, defined as the temperature where G' increases in a temperature scan after the initial drop with temperature corresponding to melt flow, changes less than 50° C., less than 40° C., less than 30° C., less than 20° C. or less than 15° C. In addition, a tan delta above 0.05 can be maintained after aging, something that is not accomplished with materials known in the art that are cured via hydrosilylation. See, e.g., Comparative Example 4.

The invention claimed is:

1. An organosiloxane block copolymer comprising:
40 to 90 mole percent disiloxy units of the formula $[R^1{}_2SiO_{2/2}]$,
10 to 60 mole percent trisiloxy units of the formula $[R^2SiO_{3/2}]$,
0.5 to 35 mole percent silanol groups [≡SiOH];
wherein:
each $R^1$, at each occurrence, is independently a $C_1$ to $C_{30}$ hydrocarbyl or a $C_1$ to $C_{30}$ hydrocarbyl group comprising at least one aliphatic unsaturated bond,
each $R^2$, at each occurrence, is independently a $C_1$ to $C_{30}$ hydrocarbyl or a $C_1$ to $C_{30}$ hydrocarbyl group comprising at least one aliphatic unsaturated bond;
wherein:
the disiloxy units $[R^1{}_2SiO_{2/2}]$ are arranged in linear blocks having an average of from 100 to 300 disiloxy units $[R^1{}_2SiO_{2/2}]$ per linear block;
the trisiloxy units $[R^2SiO_{3/2}]$ are arranged in non-linear blocks having a molecular weight of at least 500 g/mole;
at least 30% of the non-linear blocks are crosslinked with each other;
each linear block is linked to at least one non-linear block via —Si—O—Si— linkages;
the organosiloxane block copolymer has a weight average molecular weight of at least 20,000 g/mole; and
the organosiloxane block copolymer comprises from about 0.5 to about 4.5 mole % $C_1$ to $C_{30}$ hydrocarbyl group comprising at least one aliphatic unsaturated bond.

2. The organosiloxane block copolymer of claim 1, wherein the organosiloxane block copolymer comprises 12 to 22 mole percent silanol groups [≡SiOH].

3. The organosiloxane block copolymer of claim 1, wherein the organosiloxane block copolymer has a weight average molecular weight of about 40,000 g/mole to about 250,000 g/mole.

4. The organosiloxane block copolymer of claim 1, wherein the organosiloxane block copolymer comprises 1 to 35 mole percent silanol groups [≡SiOH].

5. The organosiloxane block copolymer of claim 1, wherein the organosiloxane block copolymer comprises 30 to 60 mole percent trisiloxy units of the formula $[R^2SiO_{3/2}]$.

6. A composition comprising the reaction product of:
A) a resin linear organosiloxane block copolymer comprising:
40 to 90 mole percent disiloxy units of the formula $[R^1{}_2SiO_{2/2}]$,
10 to 60 mole percent trisiloxy units of the formula $[R^2SiO_{3/2}]$,
0.5 to 35 mole percent silanol groups [≡SiOH];
wherein:
each $R^1$, at each occurrence, is independently a $C_1$ to $C_{30}$ hydrocarbyl free of aliphatic unsaturation,
each $R^2$, at each occurrence, is independently a $C_1$ to $C_{30}$ hydrocarbyl free of aliphatic unsaturation;
wherein:
the disiloxy units $[R^1{}_2SiO_{2/2}]$ are arranged in linear blocks having an average of from 50 to 300 disiloxy units $[R^1{}_2SiO_{2/2}]$ per linear block,
the trisiloxy units $[R^2SiO_{3/2}]$ are arranged in non-linear blocks having a molecular weight of at least 500 g/mole, at least 30% of the non-linear blocks are crosslinked with each other,
each linear block is linked to at least one non-linear block; and
the organosiloxane block copolymer has a weight average molecular weight of at least 20,000 g/mole; and
B) a compound of the formula $R^1R^2{}_2SiX$
wherein each $R^1$, at each occurrence, is independently a $C_1$ to $C_{30}$ hydrocarbyl free of aliphatic unsaturation or a $C_1$ to $C_{30}$ hydrocarbyl group comprising at least one aliphatic unsaturated bond,
each $R^2$, at each occurrence, is independently a $C_1$ to $C_{30}$ hydrocarbyl free of aliphatic unsaturation or a $C_1$ to $C_{30}$ hydrocarbyl group comprising at least one aliphatic unsaturated bond, and
X is a hydrolyzable group chosen from —OR$^4$, F, Cl, Br, I, —OC(O)R$^4$, —N(R$^4$)$_2$, or —ON=CR$^4{}_2$, wherein R$^4$ is hydrogen or a $C_1$ to $C_6$ alkyl group that may be optionally substituted;
wherein the reaction product is an organosiloxane block copolymer and the organosiloxane block copolymer comprises from about 0.5 to about 5 mole % $C_1$ to $C_{30}$ hydrocarbyl group comprising at least one aliphatic unsaturated bond.

7. The composition of claim 6, wherein the resin linear organosiloxane block copolymer has a weight average molecular weight of about 40,000 g/mole to about 250,000 g/mole.

8. The composition claim 6, wherein the organosiloxane block copolymer comprises 1 to 35 mole percent silanol groups [≡SiOH].

9. The composition of claim 6, wherein the organosiloxane block copolymer comprises 30 to 60 mole percent trisiloxy units of the formula $[R^2SiO_{3/2}]$.

10. A composition comprising the reaction product of:
A) a linear organosiloxane having the formula:

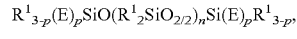

wherein each $R^1$, at each occurrence, is independently a $C_1$ to $C_{30}$ hydrocarbyl free of aliphatic unsaturation, n is 50 to 300, E is a hydrolyzable group chosen from —$OR^4$, F, Cl, Br, I, —$OC(O)R^4$, —$N(R^4)_2$, or —$ON=CR^4_2$, wherein $R^4$ is hydrogen or a $C_1$ to $C_6$ alkyl group, and each p is, independently, 1; 2 or 3; and B) an organosiloxane resin comprising unit formula:

$$[R^1{}_2R^2SiO_{1/2}]_a[R^1R^2SiO_{2/2}]_b[R^1SiO_{3/2}]_c[R^2SiO_{3/2}]_d[SiO_{4/2}]_e,$$

wherein:

each $R^1$, at each occurrence, is independently a $C_1$ to $C_{30}$ hydrocarbyl free of aliphatic unsaturation or a $C_1$ to $C_{30}$ hydrocarbyl group comprising at least one aliphatic unsaturated bond, each $R^2$, at each occurrence, is independently a $C_1$ to $C_{30}$ hydrocarbyl free of aliphatic unsaturation or a $C_1$ to $C_{30}$ hydrocarbyl group comprising at least one aliphatic unsaturated bond, wherein the organosiloxane resin comprises 0.5 to 35 mole % silanol groups [≡SiOH], and the subscripts a, b, c, d, and e represent the mole fraction of each siloxy unit present in the organosiloxane resin and range as follows:

a is about 0 to about 0.6,
b is about 0 to about 0.6,
c is about 0 to about 1,
d is about 0 to about 1,
e is about 0 to about 0.6, with the provisos that b+c+d+e>0 and a+b+c+d+e≤1;

wherein the reaction product is an organosiloxane block copolymer and the organosiloxane block copolymer comprises from about 0.5 to about 5 mole % $C_1$ to $C_{30}$ hydrocarbyl group comprising at least one aliphatic unsaturated bond.

11. A composition comprising the reaction product of:

A) a linear organosiloxane having the formula:

$$R^1{}_{3-p}(E)_pSiO(R^1{}_2SiO_{2/2})_nSi(E)_pR^1{}_{3-p},$$

wherein each $R^1$, at each occurrence, is independently a $C_1$ to $C_{30}$ hydrocarbyl free of aliphatic unsaturation, n is 50 to 300, E is a hydrolyzable group chosen from —$OR^4$, F, Cl, Br, I, —$OC(O)R^4$, —$N(R^4)_2$, or —$ON=CR^4_2$, wherein $R^4$ is hydrogen or a $C_1$ to $C_6$ alkyl group, and each p is, independently, 1, 2 or 3, and B) an organosiloxane resin comprising unit formula:

$$[R^1{}_2R^2SiO_{1/2}]_a[R^1R^2SiO_{2/2}]_b[R^1SiO_{3/2}]_c[R^2SiO_{3/2}]_d[SiO_{4/2}]_e,$$

wherein:

each $R^1$, at each occurrence, is independently a $C_1$ to $C_{30}$ hydrocarbyl free of aliphatic unsaturation, each $R^2$, at each occurrence, is independently a $C_1$ to $C_{30}$ hydrocarbyl free of aliphatic unsaturation, wherein the organosiloxane resin comprises 0.5 to 35 mole % silanol groups [≡SiOH], and the subscripts a, b, c, d, and e represent the mole fraction of each siloxy unit present in the organosiloxane resin and range as follows:

a is about 0 to about 0.6,
b is about 0 to about 0.6,
c is about 0 to about 1,
d is about 0 to about 1,
e is about 0 to about 0.6, with the provisos that b+c+d+e>0 and a+b+c+d+e≤1; and C) a compound of the formula $R^1{}_qSiX_{4-q}$ wherein each $R^1$, at each occurrence, is independently a $C_1$ to $C_{30}$ hydrocarbyl free of aliphatic unsaturation or a $C_1$ to $C_{30}$ hydrocarbyl group comprising at least one aliphatic unsaturated bond, q is 0, 1 or 2, and, each X is independently a hydrolyzable group chosen from —$OR^4$, F, Cl, Br, I, —$OC(O)R^4$, —$N(R^4)_2$, or —$ON=CR^4_2$, wherein $R^4$ is hydrogen or a $C_1$ to $C_6$ alkyl group that may be optionally substituted;

wherein the reaction product is an organosiloxane block copolymer and the organosiloxane block copolymer comprises from about 0.5 to about 5 mole % $C_1$ to $C_{30}$ hydrocarbyl group comprising at least one aliphatic unsaturated bond.

12. The composition of claim 11, wherein the product of the contacting between A) and B) is contacted with C).

13. The composition of claim 6, wherein the reaction product is contacted with a compound of the formula $R^5{}_qSiX_{4-q}$, wherein each $R^5$ is independently a $C_1$ to $C_8$ hydrocarbyl or a $C_1$ to $C_8$ halogen-substituted hydrocarbyl; and each X is independently a hydrolyzable group chosen from —$OR^4$, F, Cl, Br, I, —$OC(O)R^4$, —$N(R^4)_2$, or —$ON=CR^4_2$, wherein $R^4$ is hydrogen or a $C_1$ to $C_6$ alkyl group that may be optionally substituted.

14. The composition of claim 10, wherein E is acetoxy and p is 1.

15. The composition of claim 6 further comprising a compound having unit formula:

$$[R^1{}_2SiO_{1/2}]_a[R^1R^2SiO_{2/2}]_b[R^1SiO_{3/2}]_c[R^2SiO_{3/2}]_d[SiO_{4/2}]_e$$

comprising 0 to 35 mole % silanol groups [≡SiOH], wherein:

each $R^1$, at each occurrence, is independently H, a silane radical of the formula —$[R^5R^6Si]_k[R^5R^6SiH]$ (wherein $R^5$, $R^6$ are independently a H or a $C_1$ to $C_{30}$ hydrocarbyl free of aliphatic unsaturation, k is an integer from 0 to 10) or a $C_1$ to $C_{30}$ hydrocarbyl free of aliphatic unsaturation, each $R^2$, at each occurrence, is independently H or, a silane radical of the formula —$[R^5R^6Si]_k[R^5R^6SiH]$ (wherein $R^5$, $R^6$ are independently a H or a $C_1$ to $C_{30}$ hydrocarbyl free of aliphatic unsaturation, k is an integer from 0 to 10) a $C_1$ to $C_{30}$ hydrocarbyl free of aliphatic unsaturation, wherein the subscripts a, b, c, d, and e represent the mole fraction of each siloxy unit present and range as follows:

a is about 0 to about 0.6,
b is about 0 to about 0.6,
c is about 0 to about 1,
d is about 0 to about 1,
e is about 0 to about 0.6, with the provisos that:
b+c+d+e>0 and a+b+c+d+e≤1, and
at least 1 mole % of $R^1$ and/or $R^2$ are H or SiH containing silane radical.

16. The composition of claim 6 further comprising a hydrosilylation catalyst.

17. The composition of claim 6, further comprising free resin that is not part of the block copolymer.

18. The composition of claim 6, wherein the composition is curable.

19. The curable composition of claim 18, wherein the curable composition has a cure speed in Pa/min of from about 1 to about 20 Pa/min at a heating rate of 5° C./min.

20. The curable composition of claim 18, wherein the curable composition is curable via at least two curing mechanisms.

21. The curable composition of claim 20, wherein said at least two curing mechanisms comprise hydrosylilation cure and condensation cure.

22. The composition of claim 6, wherein the composition is solid.

23. The composition of claim 22, further comprising free resin that is not part of the block copolymer.

24. The composition of claim 22, wherein the solid composition is a solid film composition.

25. The composition of claim 22, wherein the solid film composition has an optical transmittance of at least 95% at a film thickness of 0.5 mm or greater.

26. The cured product of the compositions of claim 6.

27. The cured product of claim 26, wherein the product is cured in the absence of a condensation catalyst.

28. The cured product of claim 26, wherein the product is cured in the presence of a phosphor or a filler.

29. The cured product of claim 26, wherein the ratio of the Young's modulus of the cured product after aging for 50 hours at 225° C. and the Young's modulus before aging is less than 3.

30. The cured product of claim 26, wherein the cured product generates less than 200 ppm benzene after 30 minutes at 180° C.

31. The cured product of claim 26, wherein the CIE b* value after aging for 72 h at 235° C. is no more than about 6.

* * * * *

UNITED STATES PATENT AND TRADEMARK OFFICE
CERTIFICATE OF CORRECTION

PATENT NO. : 9,765,192 B2
APPLICATION NO. : 15/023137
DATED : September 19, 2017
INVENTOR(S) : John Bernard Horstman, Steven Swier and Yanhu Wei Page 1 of 1

It is certified that error appears in the above-identified patent and that said Letters Patent is hereby corrected as shown below:

In the Claims

At Claim 10, Column 39, Lines 33-37 read:
"wherein the reaction product is an organosiloxane block copolymer and the organosiloxane block copolymer comprises from about 0.5 to about 5 mole $C_1$ to $C_{30}$ hydrocarbyl group comprising at least one aliphatic unsaturated bond."

Should read:
"wherein the reaction product is an organosiloxane block copolymer and the organosiloxane block copolymer comprises from about 0.5 to about 5 mole % $C_1$ to $C_{30}$ hydrocarbyl group comprising at least one aliphatic unsaturated bond."

Signed and Sealed this
Thirtieth Day of January, 2018

Joseph Matal
*Performing the Functions and Duties of the*
*Under Secretary of Commerce for Intellectual Property and*
*Director of the United States Patent and Trademark Office*